(12) United States Patent
Ohkubo et al.

(10) Patent No.: US 11,435,662 B2
(45) Date of Patent: Sep. 6, 2022

(54) MASK BLANK, METHOD FOR MANUFACTURING TRANSFER MASK, AND METHOD FOR MANUFACTURING SEMICONDUCTOR DEVICE

(71) Applicant: HOYA CORPORATION, Tokyo (JP)

(72) Inventors: Ryo Ohkubo, Tokyo (JP); Hiroaki Shishido, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/391,593

(22) Filed: Aug. 2, 2021

(65) Prior Publication Data

US 2021/0364910 A1 Nov. 25, 2021

Related U.S. Application Data

(63) Continuation of application No. 16/603,127, filed as application No. PCT/JP2018/014039 on Apr. 2, 2018, now Pat. No. 11,119,400.

(30) Foreign Application Priority Data

Apr. 8, 2017 (JP) ................................. 2017-077200

(51) Int. Cl.
*G03F 1/32* (2012.01)

(52) U.S. Cl.
CPC ..................... *G03F 1/32* (2013.01)

(58) Field of Classification Search
CPC .......................................................... G03F 1/32
USPC ........................................................... 430/5
See application file for complete search history.

(56) References Cited

U.S. PATENT DOCUMENTS

| | | | |
|---|---|---|---|
| 5,380,608 A | 1/1995 | Miyashita et al. | |
| 2007/0212618 A1 | 9/2007 | Yoshikawa et al. | |
| 2014/0004449 A1 | 1/2014 | Nam et al. | |
| 2015/0160549 A1 | 6/2015 | Sasamoto et al. | |
| 2015/0338731 A1 | 11/2015 | Nozawa et al. | |
| 2016/0187769 A1 | 6/2016 | Nozawa et al. | |
| 2016/0202602 A1 | 7/2016 | Shishido et al. | |
| 2016/0291453 A1 | 10/2016 | Inazuki et al. | |
| 2016/0377975 A1 | 12/2016 | Matsumoto et al. | |
| 2019/0040516 A1 | 2/2019 | Ohkubo et al. | |

FOREIGN PATENT DOCUMENTS

| | | |
|---|---|---|
| JP | S5437579 A | 11/1979 |
| JP | H04125643 A | 11/1992 |
| JP | 05289305 A | 11/1993 |
| JP | 2007241065 A | 9/2007 |
| JP | 2014010454 A | 1/2014 |
| JP | 2014137388 A | 7/2014 |
| JP | 2015111212 A | 6/2015 |
| JP | 2015222448 A | 12/2015 |
| JP | 2016188958 A | 11/2016 |
| JP | 2016191784 A | 11/2016 |
| JP | 2016191872 A | 11/2016 |
| SG | 11201803116 U | 5/2018 |
| WO | 2017141605 A1 | 10/2018 |

OTHER PUBLICATIONS

U.S. Appl. No. 16/603,127, Notice of Allowance, dated May 19, 2021, 7 pages.
English Translation of International Search Report dated Mar. 8, 2018, in International Application No. PCT/JP2018/002072.
English Translation of International Search Report dated Jun. 12, 2018, in International Application No. PCT/JP2018/014039.
Application No. SG11201909351R, Search Report and Written Opinion, dated Apr. 23, 2020, 8 pages.
U.S. Appl. No. 16/488,901, "Notice of Allowance", dated Dec. 1, 2021, 10 pages.

*Primary Examiner* — Christopher G Young
(74) *Attorney, Agent, or Firm* — Kilpatrick Townsend & Stockton LLP

(57) ABSTRACT

In the present invention, an etching stopper film (2), a light-blocking film (3) comprising a material containing one or more elements selected from among silicon and tantalum, and a hard mask film (4) are laminated in that order on a translucent substrate (1). The etching stopper film is made of a material containing chromium, oxygen and carbon, the chromium content is 50 atom % or more, the maximum peak in a N1s narrow spectrum obtained by means of analysis using X-Ray photoelectron spectroscopy is below the detection limit, and a Cr2p narrow spectrum obtained by means of analysis using X-Ray photoelectron spectroscopy has a maximum peak at a bond energy of 574 eV or less.

13 Claims, 12 Drawing Sheets

MASK BLANK, METHOD FOR MANUFACTURING TRANSFER MASK, AND METHOD FOR MANUFACTURING SEMICONDUCTOR DEVICE

CROSS REFERENCE TO RELATED APPLICATIONS

This application is a continuation of U.S. application Ser. No. 16/603,127, filed Oct. 4, 2019, which is a National Stage of International Application No. PCT/JP2018/014039 filed Apr. 2, 2018, which claims priority to Japanese Patent Application No. 2017-077200 filed Apr. 8, 2017, and the contents of which are incorporated by reference in their entirety.

TECHNICAL FIELD

This disclosure relates to a mask blank, a method for manufacturing a transfer mask using the mask blank, and a method for manufacturing a semiconductor device using the transfer mask manufactured by the above-mentioned manufacturing method. In particular, this disclosure relates to a mask blank to be suitably used in an exposure apparatus using, as an exposure light source, exposure light having a short wavelength of 200 nm or less, a method for manufacturing a transfer mask, and a method for manufacturing a semiconductor device.

BACKGROUND ART

Generally, in a manufacturing process of a semiconductor device, fine pattern formation is carried out using photolithography. For the fine pattern formation, a number of substrates called transfer masks (photomasks) are normally used. The transfer mask generally comprises a transparent glass substrate and a fine pattern formed thereon and made of a metal thin film or the like. In manufacture of the transfer mask, photolithography is used also.

The transfer mask serves as an original plate for transferring the same fine pattern in large quantities. Therefore, dimensional accuracy of the pattern formed on the transfer mask directly affects dimensional accuracy of a fine pattern to be prepared using the transfer mask. In recent years, there is a remarkable progress in miniaturization of a pattern of the semiconductor device. Correspondingly, a mask pattern formed on the transfer mask is required to be miniaturized and to have higher pattern accuracy. On the other hand, in addition to the miniaturization of the pattern on the transfer mask, there is a progress in shortening a wavelength of an exposure light source used in photolithography. Specifically, as the exposure light source upon manufacture of the semiconductor device, shortening of the wavelength advances from a KrF excimer laser (wavelength: 248 nm) to a wavelength of 200 nm or less, for example, an ArF excimer laser (wavelength: 193 nm).

As a type of the transfer mask, a halftone phase shift mask is known in addition to an existing binary mask comprising a transparent substrate and a light shielding film pattern formed thereon and made of a chromium-based material. The halftone phase shift mask comprises a transparent substrate and a pattern of a light semi-transmissive film formed thereon. The light semi-transmissive film (halftone phase shift film) has a function of allowing light to be transmitted therethrough with an intensity which does not substantially contribute to exposure and of causing the light having been transmitted through the light semi-transmissive film to have a predetermined phase difference with respect to light having been transmitted through air by the same distance. Thus, a so-called phase shift effect is produced.

In recent years, there appears a binary mask blank comprising a transparent substrate and a light shielding film formed thereon and made of a silicon-based material or a tantalum-based material, or the like. There is also known a phase shift mask blank which comprises a phase shift film and a light-shielding film formed thereon and made of a material containing transition metal and silicon (Patent Document 1). In the phase shift mask blank, a material containing transition metal and silicon is also used as a material of the phase shift film. Therefore, it is difficult to assure etch selectivity for dry etching between the phase shift film and the light-shielding film. In view of the above, in the phase shift mask blank disclosed in Patent Document 1, an etching stopper film made of a chromium-based material is formed between the phase shift film and the light-shielding film.

Also in the above-mentioned binary mask blank comprising the transparent substrate and the light-shielding film formed thereon and made of the silicon-based material or the tantalum-based material, it is difficult to assure etch selectivity for dry etching between a glass substrate, for example, which is used as the transparent substrate, and the light-shielding film. Therefore, an etching stopper film made of a chromium-based material may be formed between the glass substrate and the light-shielding film.

PRIOR ART DOCUMENT(S)

Patent Document(s)

Patent Document 1: JP 2007-241065 A

SUMMARY OF THE DISCLOSURE

Problem to be Solved by the Disclosure

For example, in order to prepare a transfer mask (binary mask) by using the above-mentioned mask blank having the structure in which the etching stopper film made of the chromium-based material and the light shielding film made of the silicon-based material or the tantalum-based material are laminated on the transparent substrate (glass substrate) in this order, the following steps may be performed. At first, through dry etching using, as a mask, a resist film having a transfer pattern (the transfer pattern is a pattern to be formed on the light shielding film) and formed on a surface of the mask blank and using a fluorine-based gas, a transfer pattern is formed on the light shielding film. Then, through dry etching using, as a mask, the light shielding film with the transfer pattern formed thereon and using a mixture of a chlorine-based gas and an oxygen gas, a transfer pattern is formed on the etching stopper film. Thus, the transfer mask having a light shielding film pattern formed on the transparent substrate and made of a silicon-based material or a tantalum-based material is completed.

As described above, through the dry etching using, as a mask, the light shielding film provided with the transfer pattern and using the mixture of the chlorine-based gas and the oxygen gas, the transfer pattern is formed on the etching stopper film of the chromium-based material. In the dry etching using the mixture of the chlorine-based gas and the oxygen gas as an etching gas, a tendency of anisotropic etching is small while a tendency of isotropic etching is large. Generally, in case where a pattern is formed on a thin film through dry etching, not only etching in a thickness direction of the thin film but also etching in a side wall direction of the pattern to be formed on the thin film, i.e., so-called side etching, progresses. In order to suppress the progress of the side etching, it has already been practiced, upon dry etching, to apply a bias voltage on the side opposite to a main surface of the transparent substrate that is provided with the thin film, thereby controlling so that more etching gas is brought into contact with the film in the thickness direction thereof. In case of ion-based dry etching using an etching gas, such as a fluorine-based gas used in dry etching of the light shielding film, having a high tendency to generate ionic plasma, controllability of an etching direction by applying the bias voltage is high and anisotropy of etching is enhanced. Therefore, it is possible to minimize a side etching amount of the thin film to be etched. On the other hand, in case of the dry etching using the mixture of the chlorine-based gas and the oxygen gas, the oxygen gas has a high tendency to generate radical plasma. Therefore, an effect of controlling the etching direction by applying the bias voltage is small and anisotropy of the etching is difficult to enhance. Accordingly, when a pattern is formed on the thin film made of the chromium-based material through dry etching using the mixture of the chlorine-based gas and the oxygen gas, the side etching amount tends to increase.

For example, in case of a line-and-space pattern, progress of side etching on both sides of the pattern of the above-mentioned etching stopper film causes thinning of the pattern of the etching stopper film, which may result in collapse of the transfer pattern (light-shielding film pattern). In the phase shift mask blank disclosed in the above-mentioned Patent Document 1 also, when collapse of the light-shielding film pattern due to the above-mentioned thinning of the pattern of the etching stopper film occurs during the process of manufacturing the phase shift mask from the mask blank, it is difficult to accurately pattern the phase shift film directly under the etching stopper film.

As described above, there is a remarkable progress in miniaturization of the mask pattern in recent years. It is required to form a fine pattern, such as a SRAF (Sub Resolution Assist Features) pattern, having a size of 50 nm or less with high pattern accuracy. As the pattern to be formed is more miniaturized, an aspect ratio is increased to cause easy occurrence of pattern collapse. Therefore, it is a serious problem to suppress the above-mentioned collapse of the transfer pattern due to thinning of the pattern of the etching stopper film.

This disclosure has been made in order to solve the above-mentioned existing problems. A first aspect of this disclosure is to provide a mask blank which has a structure such that an etching stopper film made of a chromium-based material and a pattern-forming thin film made of a silicon-based material or a tantalum-based material are laminated on a transparent substrate in this order, and which is capable of reducing a side etching amount generated on a pattern side wall of the etching stopper film even in case where the etching stopper film is patterned through dry etching in a high-bias condition using, as a mask, pattern-forming thin film provided with a transfer pattern and using a mixture of a chlorine-based gas and an oxygen gas, thereby suppressing collapse of the transfer pattern due to thinning of a pattern of the etching stopper film.

A second aspect of this disclosure is to provide a method for manufacturing a transfer mask provided with a high-accuracy fine transfer pattern by using the mask blank.

A third aspect of this disclosure is to provide a method for manufacturing a semiconductor device capable of carrying out, by using the transfer mask, high-accuracy pattern transfer onto a resist film on a semiconductor substrate.

Means to Solve the Problem

In order to solve the above-mentioned problems, the present inventors focused particularly on analyzing a depth direction chemical bonding state of the thin film and continued an intensive study to complete this disclosure. Specifically, in order to solve the above-mentioned problems, this disclosure has the following configurations.

(Configuration 1)

A mask blank having a structure in which an etching stopper film and a pattern-forming thin film are laminated on a transparent substrate in this order, wherein the pattern-forming thin film is made of a material containing one or more elements selected from silicon and tantalum; the etching stopper film is made of a material containing chromium, oxygen, and carbon; the etching stopper film has a chromium content of 50 atomic % or more, the etching stopper film has a maximum peak of N1s narrow spectrum, obtained by analysis of X-ray photoelectron spectroscopy, which is not higher than a lower detection limit, and the etching stopper film has a maximum peak of Cr2p narrow spectrum, obtained by analysis of X-ray photoelectron spectroscopy, at a binding energy of 574 eV or less.

(Configuration 2)

The mask blank according to configuration 1, wherein a ratio of a carbon content [atomic %] divided by a total content [atomic %] of chromium, carbon, and oxygen in the etching stopper film is 0.1 or more.

(Configuration 3)

The mask blank according to configuration 1 or 2, wherein the etching stopper film has a maximum peak of Si2p narrow spectrum, obtained by analysis of X-ray photoelectron spectroscopy, which is not higher than a lower detection limit.

(Configuration 4)

The mask blank according to any one of configurations 1 to 3, wherein the etching stopper film has a chromium content of 80 atomic % or less.

(Configuration 5)

The mask blank according to any one of configurations 1 to 4, wherein the etching stopper film has a carbon content of 10 atomic % or more and 20 atomic % or less.

(Configuration 6)

The mask blank according to any one of configurations 1 to 5, wherein the etching stopper film has an oxygen content of 10 atomic % or more and 35 atomic % or less.

(Configuration 7)

The mask blank according to any one of configurations 1 to 6, wherein the etching stopper film has a difference in content of each constituent element in a thickness direction that is less than 10 atomic %.

(Configuration 8)

The mask blank according to any one of configurations 1 to 7, comprising a hard mask film formed on the pattern-forming thin film and made of a material containing chromium.

(Configuration 9)

The mask blank according to configuration 8, comprising a phase shift film formed between the transparent substrate and the etching stopper film and made of a material containing silicon.

(Configuration 10)

A method for manufacturing a transfer mask using the mask blank according to configuration 8, comprising the step of forming a transfer pattern on the hard mask film through dry etching using, as a mask, a resist film formed on the hard mask film and having a transfer pattern and using a mixture of a chlorine-based gas and an oxygen gas; the step of forming a transfer pattern on the pattern-forming thin film through dry etching using, as a mask, the hard mask film provided with the transfer pattern and using a fluorine-based gas; and the step of forming a transfer pattern on the etching stopper film and removing the hard mask film through dry etching using, as a mask, the pattern-forming thin film provided with the transfer pattern and using a mixture of a chlorine-based gas and an oxygen gas.

(Configuration 11)

A method for manufacturing a transfer mask using the mask blank according to configuration 9, comprising the step of forming a transfer pattern on the hard mask film through dry etching using, as a mask, a resist film formed on the hard mask film and having a transfer pattern and using a mixture of a chlorine-based gas and an oxygen gas; the step of forming a transfer pattern on the pattern-forming thin film through dry etching using, as a mask, the hard mask film provided with the transfer pattern and using a fluorine-based gas; the step of forming, on the hard mask film, a resist film having a light shielding pattern; the step of forming, through dry etching using a mixture of a chlorine-based gas and an oxygen gas, a transfer pattern on the etching stopper film by using, as a mask, the pattern-forming thin film provided with the transfer pattern and simultaneously forming a light shielding pattern on the hard mask film by using, as a mask, the resist film having the light shielding pattern; the step of forming, through dry etching using a fluorine-based gas, a transfer pattern on the phase shift film by using, as a mask, the etching stopper film provided with the transfer pattern and simultaneously forming a light shielding pattern on the pattern-forming thin film by using, as a mask, the hard mask film having the light shielding pattern; and the step of forming a light shielding pattern on the etching stopper film and removing the hard mask film through dry etching using, as a mask, the pattern-forming thin film provided with the light shielding pattern and using a mixture of a chlorine-based gas and an oxygen gas.

(Configuration 12)

A method for manufacturing a semiconductor device, comprising the step of exposure-transferring a transfer pattern onto a resist film on a semiconductor substrate by using a transfer mask manufactured by the method for manufacturing a transfer mask according to configuration 10 or 11.

Effect of the Disclosure

According to the mask blank of this disclosure, the mask blank has a structure in which an etching stopper film made of a chromium-based material and a pattern-forming thin film made of a silicon-based material or a tantalum-based material are laminated on a transparent substrate in this order. With the mask blank, even if the etching stopper film is patterned through dry etching in a high-bias condition using, as a mask, the pattern-forming thin film provided with a transfer pattern and using a mixture of a chlorine-based gas and an oxygen gas, it is possible to reduce a side etching amount generated on a pattern side wall of the etching stopper film. Thus, it is possible to suppress collapse of the transfer pattern due to thinning of a pattern of the etching stopper film and to accurately form a fine pattern. In addition, by using the mask blank, it is possible to manufacture a transfer mask provided with a high-accuracy fine transfer pattern. Furthermore, by carrying out pattern trans-fer on a resist film of a semiconductor substrate using the transfer mask, it is possible to manufacture a high-quality semiconductor device provided with a device pattern excellent in pattern accuracy.

MODE FOR EMBODYING THE DISCLOSURE

Figure 1:
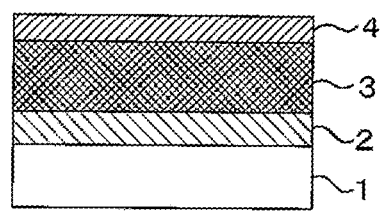
FIG. 1 is a schematic sectional view of a mask blank according to a first embodiment of this disclosure.

Hereinafter, embodiments of this disclosure will be described in detail with reference to the drawings.

At first, a history how to reach this disclosure will be described.

As means for solving the problem of side etching in dry etching of a thin film of a chromium-based material, it is considered to significantly increase, in dry etching using a mixed gas of a chlorine-based gas and an oxygen gas, a mixing ratio of the chlorine-based gas in the mixture. This is because the chlorine-based gas has a high tendency to generate ionic plasma. However, in the dry etching using the mixture of the chlorine-based gas and the oxygen gas with an increased mixing ratio of the chlorine based gas, an etching rate of the thin film of the chromium-based material is inevitably decreased. In order to supplement the decrease in etching rate of the thin film of the chromium-based material, it is also considered to significantly increase a bias voltage applied during the dry etching. In the following description, the dry etching which uses the mixture of the chlorine-based gas and the oxygen gas with an increased mixing ratio of the chlorine-based gas and which is carried out in a state where a high bias voltage is applied will simply be called "dry etching in a high-bias condition."

In dry etching in a high-bias condition for a chromium-based material film, an etching rate of etching in a film thickness direction can considerably be increased as compared with dry etching at a normal bias voltage using the same condition of etching gas (hereinafter will be called "dry etching in a normal condition"). Generally, upon dry etching of a thin film, both dry etching by a chemical reaction and dry etching by a physical action are carried out. The dry etching by the chemical reaction is carried out in a process that an etching gas in a plasma state is brought into contact with a surface of the thin film and is bonded to metal elements in the thin film to generate a low-boiling-point compound to be sublimated. On the other hand, the dry etching by the physical action is carried out in a process that ionic plasma in an etching gas accelerated by a bias voltage collides with a surface of a thin film to physically eject respective elements, including metal elements, on the surface of the thin film, to generate a low-boiling-point compound with the metal elements that is sublimated.

In the dry etching in the high-bias condition, the dry etching by the physical action is enhanced as compared with the dry etching in the normal condition. The dry etching by the physical action significantly contributes to etching in the film thickness direction but does not much contribute to etching in a side wall direction of a pattern. On the other hand, the dry etching by the chemical reaction contributes to both the etching in the film thickness direction and the etching in the side wall direction of the pattern. Therefore, in order to reduce a side etching amount than before, it may be desirable to reduce easiness of being dry-etched by the chemical reaction in the chromium-based material film than before and to maintain easiness of being dry-etched by the physical action to a same level as before.

In order to reduce the etching amount according to the dry etching by the chemical reaction in the chromium-based material film, for example, it is proposed to increase a chromium content in the chromium-based material film. However, if the chromium content in the chromium-based material film is too large, the etching amount by the physical action becomes significantly small and the etching rate of the chromium-based material film is significantly decreased. When the etching rate of the chromium-based material film is significantly decreased, an etching time becomes considerably long when the chromium-based material film is patterned, and a side wall of the pattern is exposed to the etching gas for a longer time duration. This leads to an increase of the side etching amount. Therefore, the technique of simply increasing the chromium content in the chromium-based material film significantly decreases the etching rate of the film and is not relevant to suppression of the side etching amount.

In view of the above, the present inventors studied about constituent elements in the chromium-based material film other than chromium. In order to suppress the side etching amount, it is effective to contain light elements which consume oxygen radicals promoting the dry etching by the chemical reaction. The light elements which can be contained in a predetermined amount or more in a chromium-based material forming an etching stopper film include oxygen, nitrogen, carbon, and so on.

For example, by making oxygen be contained in the chromium-based material forming the etching stopper film in this disclosure, the etching rate is considerably increased in both the dry etching in the high-bias condition and the dry etching in the normal condition. Simultaneously, side etching tends to easily progress. However, taking into account that the etching stopper film generally has a thickness of 20 nm or less and that the etching time in the film thickness direction is significantly shortened, it may be required for oxygen to be contained in the chromium-based material forming the etching stopper film in case of the dry etching in the high-bias condition.

When the chromium-based material forming the etching stopper film contains nitrogen, the etching rate is increased in both the dry etching in the high-bias condition and the dry etching in the normal condition, although not so remarkable as compared with the case of containing oxygen. Simultaneously, however, the side etching tends to easily progress. When the chromium-based material contains nitrogen, the easiness in progress of the side etching is increased as compared with the degree of shortening the etching time in the film thickness direction. Taking the above into account, it is desired that, in case of the dry etching in the high-bias condition, the chromium-based material forming the etching stopper film does not contain nitrogen.

In case of the dry etching in the normal condition, when the chromium-based material contains carbon, the etching rate is slightly decreased as compared with the case of a film consisting of chromium only. However, if the chromium-based material contains carbon, resistance against the dry etching by the physical action is lowered as compared with the case of the film consisting of chromium only. Therefore, in case of the dry etching in the high-bias condition having a great tendency of the dry etching by the physical action, if the chromium-based material contains carbon, the etching rate is increased as compared with the case of the film consisting of chromium only. When the chromium-based material contains carbon, the oxygen radicals promoting the side etching are consumed. Therefore, as compared with the case where oxygen or nitrogen is contained, the side etching is difficult to progress. Taking the above into account, in case of the dry etching in the high-bias condition, it may be required for carbon to be contained in the chromium-based material forming the etching stopper film.

The above-mentioned significant difference arises between the case where nitrogen is contained in the chromium-based material and the case where carbon is contained in the chromium-based material. This results from a difference between Cr—N bond and Cr—C bond. Cr—N bond has a low binding energy and dissociation of the bond tends to easily occur. Therefore, if chlorine and oxygen in a plasma state are brought into contact, Cr—N bond is easily dissociated to form chromyl chloride having a low boiling point. On the other hand, Cr—C bond has a high binding energy and dissociation of the bond is difficult to occur. Therefore, even if chlorine and oxygen in a plasma state are brought into contact, Cr—C bond is difficult to be dissociated to form chromyl chloride having a low boiling point.

As described above, the etching in the high-bias condition has a great tendency of the dry etching by the physical action. In the dry etching by the physical action, the elements in the thin film are ejected by ion bombardment to cause a state where the bond between the elements is broken. Therefore, a difference in easiness of formation of chromyl chloride resulting from a difference in level of the binding energy between the elements is small as compared with the case of the dry etching by the chemical reaction. As described above, the dry etching by the physical action significantly contributes to the etching in the film thickness direction but does not much contribute to the etching in the side wall direction of the pattern. Therefore, in the dry etching in the high-bias condition in the film thickness direction of the etching stopper film made of the chromium-based material, a difference in degree of progress of the etching is small between Cr—N bond and Cr—C bond.

In comparison, in the side etching advancing in the side wall direction of the pattern, the tendency of the dry etching by the chemical reaction is high. Therefore, if an abundance ratio of Cr—N bond in the chromium-based material forming the etching stopper film is high, the side etching tends to easily progress. On the other hand, if an abundance ratio of Cr—C bond in the chromium-based material forming the etching stopper film is high, the side etching is difficult to progress.

The present inventors comprehensively considered the above matters and further focused on analyzing a chemical bonding state in the depth direction of the thin film. As a result, it is concluded that, in order to solve the above-mentioned problems, a mask blank is desired to be configured as follows. The mask blank has a structure in which an etching stopper film and a pattern-forming thin film (for example, a light-shielding film) are laminated on a transparent substrate in this order and the pattern-forming thin film is made of a material containing at least one element selected from silicon and tantalum. In the mask blank, the etching stopper film patterned by, for example, the dry etching in the high-bias condition using, as a mask, the pattern-forming thin film provided with a transfer pattern is made of a material containing chromium, oxygen, and carbon. The etching stopper film has a chromium content of 50 atomic % or more. The etching stopper film has a maximum peak of N1s narrow spectrum, obtained by analysis of X-ray photoelectron spectroscopy, which is not higher than a lower detection limit. The etching stopper film has a maximum peak of Cr2p narrow spectrum, obtained by analysis of X-ray photoelectron spectroscopy, at a binding energy of 574 eV or less. Thus, this disclosure has been completed.

Now, this disclosure will be described in detail on the basis of embodiments.

First Embodiment

FIG. 1 is a schematic sectional view for illustrating a mask blank according to a first embodiment of this disclosure.

As illustrated in FIG. 1, the mask blank 10 according to the first embodiment of this disclosure is a binary mask blank having a structure in which an etching stopper film 2 and a light shielding film 3 as a pattern-forming thin film are laminated on a transparent substrate 1 in this order, and a hard mask film 4 is formed on the light shielding film 3.

Herein, the transparent substrate 1 in the mask blank 10 is not particularly limited as far as the substrate is for use in a transfer mask for manufacture of a semiconductor device. The transparent substrate 1 is not particularly limited as far as the substrate is transparent with respect to an exposure wavelength used in exposure transfer of a pattern onto a semiconductor substrate during manufacture of the semiconductor device. A synthetic quartz substrate and other various types of glass substrates (for example, soda lime glass, aluminosilicate glass, and so on) may be used. Among others, the synthetic quartz substrate is particularly preferably used because it is highly transparent to an ArF excimer laser (wavelength: 193 nm) effective in fine pattern formation or in a region of a shorter wavelength.

It may be desirable for the etching stopper film 2 to be a material having high etch selectivity with respect to the light shielding film 3 directly thereon. In this disclosure, by selecting a chromium-based material as a material of the etching stopper film 2, it is possible to secure high etch selectivity with respect to the light shielding film 3 made of a silicon-based material or a tantalum-based material.

Next, the structure of the etching stopper film 2 in this disclosure will be described further in detail. The etching stopper film 2 is made of a material containing chromium (Cr), oxygen (O), and carbon (C).

The etching stopper film 2 has a substantially constant composition. Specifically, it is desirable that a difference in content of each constituent element in a thickness direction is less than 10 atomic %. In this disclosure, a thickness direction is a direction that is orthogonal to the surface.

In this disclosure, the etching stopper film 2 has a chromium content of 50 atomic % or more. If the chromium content is 50 atomic % or more, it is possible to suppress side etching caused when the etching stopper film 2 is patterned by the dry etching in the high-bias condition using, as a mask, the light shielding film 3 provided with a transfer pattern.

The etching stopper film 2 preferably has a chromium content of 80 atomic % or less. If the chromium content is greater than 80 atomic %, an etching rate is significantly decreased when the etching stopper film 2 is patterned by the dry etching in the high-bias condition. Therefore, in order to sufficiently secure the etching rate when the etching stopper film 2 is patterned by the dry etching in the high-bias condition, the etching stopper film 2 preferably has a chromium content of 80 atomic % or less as described above.

In this disclosure, the etching stopper film 2 has a maximum peak of N1s narrow spectrum, obtained by analysis of X-ray photoelectron spectroscopy (XPS), which is not higher than a lower detection limit.

If the peak of N1s narrow spectrum exists, Cr—N bond exists in the chromium-based material forming the etching stopper film 2 at a predetermined ratio or more. If Cr—N bond exists in the material forming the etching stopper film 2 at the predetermined ratio or more, it is difficult to suppress the progress of side etching when the etching stopper film 2 is patterned by the dry etching in the high-bias condition. In this disclosure, the content of nitrogen (N) in the etching stopper film 2 is desirably equal to or less than a detection limit value.

In this disclosure, the etching stopper film 2 has a maximum peak of Cr2p narrow spectrum, obtained by the analysis of X-ray photoelectron spectroscopy, at a binding energy of 574 eV or less.

In case where the chromium-based material is in the state where Cr2p narrow spectrum has a maximum peak at a binding energy higher than 574 eV, i.e., in the state of chemical shift, this represents a state where an abundance ratio of chromium atoms bonded to other atoms (particularly, nitrogen) is high. Such a chromium-based material tends to have low resistance against dry etching by a chemical reaction contributing to etching in a side wall direction of a pattern. Therefore, it is difficult to suppress the progress of the side etching. In comparison, in case where the etching stopper film 2 is made of a chromium-based material having a maximum peak of Cr2p narrow spectrum, obtained by analysis of X-ray photoelectron spectroscopy, at a binding energy of 574 eV or less as in this disclosure, it is possible to suppress the progress of the side etching when the etching stopper film 2 is patterned by the dry etching in the high-bias condition.

In this disclosure, a ratio Cc/Ct of the content Cc [atomic %] of carbon in the etching stopper film 2 divided by the total content Ct [atomic %] of chromium, carbon, and oxygen is preferably equal to 0.1 or more, more preferably equal to or 0.14 or more. In this disclosure, the etching stopper film 2 is made of a material containing chromium, oxygen, and carbon. Most of chromium in the etching stopper film 2 exists in any of the form of Cr—O bond, the form of Cr—C bond, and the form of no bond with either oxygen or carbon. Therefore, in the chromium-based material with a high ratio Cc/Ct of the content Cr [atomic %] of carbon divided by the total content Ct [atomic %] of chromium, carbon, and oxygen, an abundance ratio of Cr—C bond in the material is high. Therefore, it is possible to suppress the progress of side etching when such chromium-based material is patterned by the dry etching in the high-bias condition.

As described above, the etching stopper film 2 is made of the material containing chromium, oxygen, and carbon. The total content of chromium, oxygen, and carbon is preferably equal to 95 atomic % or more, more preferably equal to 98 atomic % or more. Particularly preferably, the etching stopper film 2 is made of chromium, oxygen, and carbon mentioned above, except for impurities inevitably mixed during film formation. Herein, the inevitably mixed impurities include those elements contained in a sputtering gas when the etching stopper film 2 is formed by sputtering, for example, the elements such as argon, helium, neon, krypton, xenon, hydrogen, and so on.

In this disclosure, the etching stopper film 2 preferably has an oxygen content not smaller than 10 atomic % and not greater than 35 atomic %. By containing oxygen in the chromium-based material forming the etching stopper film 2 at the content within the above-mentioned range, the etching rate in case of the dry etching in the high-bias condition is considerably increased so as to considerably shorten the etching time in the film thickness direction.

The etching stopper film 2 has a carbon content not smaller than 10 atomic % and not greater than 20 atomic %. By containing carbon in the chromium-based material forming the etching stopper film 2 at the content within the above-mentioned range, it is possible to increase the etching rate in case of the dry etching in the high-bias condition and to suppress the progress of side etching.

Preferably, the etching stopper film 2 has a maximum peak of Si2p narrow spectrum, obtained by analysis of X-ray photoelectron spectroscopy, which is not higher than a lower detection limit. If the peak of Si2p narrow spectrum exists, unbonded silicon or silicon bonded to other atoms exist at a predetermined ratio or more in the material forming the etching stopper film 2. Such material is not desirable because the etching rate with respect to the dry etching using a mixture of a chlorine-based gas and an oxygen gas tends to decrease. Therefore, in the etching stopper film 2, the content of silicon is preferably equal to 1 atomic % or less, desirably not higher than a lower detection limit.

Although a method for forming the etching stopper film 2 need not be particularly limited, sputtering film formation is preferable among others. The sputtering film formation is favorable because a uniform film with a constant thickness can be formed. Since a highly conductive target is used in formation of the etching stopper film 2, it is more preferable to use DC sputtering having a relatively high film formation rate.

The thickness of the etching stopper film 2 is not particularly limited but is preferably within a range, for example, not smaller than 3 nm and not greater than 20 nm, more preferably not smaller than 3.5 nm and not greater than 15 nm.

Next, the light shielding film 3 will be described.

In this embodiment, the light shielding film 3 is made of a material containing one or more elements selected from silicon and tantalum.

In this disclosure, by selecting the silicon-based material or the tantalum-based material as a material of the light shielding film 3, it is possible to secure high etch selectivity with respect to the etching stopper film 2 made of the chromium-based material.

As the material forming the light shielding film 3 and containing one or more elements selected from silicon and tantalum, the following materials are presented in this disclosure.

As a material containing silicon, there is a material consisting of silicon and nitrogen, or a material further containing one or more elements selected from metalloid elements and non-metal elements in addition to the above-mentioned material. As the metalloid elements in this case, one or more elements selected from boron, germanium, antimony, and tellurium are preferable. The non-metal elements in this case include non-metal elements in a narrow sense (nitrogen, carbon, oxygen, phosphorus, sulfur, and selenium), halogen, and noble gas.

Other materials containing silicon and suitable for the light shielding film 3 include a material containing, in addition to silicon and transition metal, one or more elements selected from oxygen, nitrogen, carbon, boron, and hydrogen. The transition metal in this case includes, for example, molybdenum (Mo), tungsten (W), titanium (Ti), tantalum (Ta), zirconium (Zr), hafnium (Hf), niobium (Nb), vanadium (V), cobalt (Co), nickel (Ni), ruthenium (Ru), tin (Sn), chromium (Cr), and so on. Such a material containing silicon and transition metal has a high light shielding performance so that the thickness of the light shielding film 3 can be reduced.

As a material containing tantalum, a material containing tantalum and one or more element selected from nitrogen, oxygen, boron, and carbon is used in addition to tantalum metal. Specifically, for example, Ta, TaN, TaO, TaON, TaBN, TaBO, TaBON, TaCN, TaCO, TaCON, TaBCN, TaBOCN, and so on are preferable.

Although a method for forming the light shielding film 3 is not particularly limited, sputtering film formation is preferable among others. The sputtering film formation is favorable because a uniform film with a constant thickness can be formed. When the light shielding film 3 is made of a material consisting of silicon and nitrogen, or a material containing one or more elements selected from metalloid elements and non-metal elements in addition to the above-mentioned material, film formation is preferably carried out using RF (Radio Frequency) sputtering or ion beam sputtering because a target has low conductivity. On the other hand, when the light shielding film 3 is made of a material containing, in addition to silicon and transition metal, one or more elements selected from oxygen, nitrogen, carbon, boron, and hydrogen or a material containing tantalum, film formation is preferably carried out using DC sputtering having a relatively high film formation rate because a target has relatively high conductivity.

The light shielding film 3 may have a single layer structure or a multilayer structure. For example, the light shielding film may have a double layer structure comprising a light shielding layer and a surface reflection prevention layer, or a three layer structure further comprising a back surface reflection prevention layer.

It may be desirable for the light shielding film 3 to secure predetermined light shieldability, for example, to have an optical density (OD), which is equal to 2.8 or more, preferably equal to 3.0 or more, with respect to exposure light of an ArF excimer laser (wavelength: 193 nm) effective for fine pattern formation.

The thickness of the light shielding film 3 is not particularly limited but is preferably equal to 80 nm or less, more preferably equal to 70 nm or less, in order to accurately form a fine pattern in the binary mask blank. On the other hand, since it may be desirable for the light shielding film 3 to secure predetermined light shieldability (optical density) as described above, the thickness of the light shielding film 3 is preferably equal to 30 nm or more, more preferably equal to 40 nm or more.

As in this embodiment, for the purpose of thinning of a resist film to be formed on the surface of the mask blank 10, it is preferable that the hard mask film (may be called "etching mask film") made of a material having an etch selectivity with respect to the light shielding film 3 is formed on the light shielding film 3.

The hard mask film 4 serves as an etching mask when the pattern is formed on the light shielding film 3 through dry etching. Therefore, it is desirable that the hard mask film 4 is formed by a material having sufficient resistance against a dry etching environment of the light shielding film 3. For the dry etching of the light shielding film 3 made of the silicon-based material or the tantalum-based material, a fluorine-based gas is normally used as an etching gas.

Accordingly, as the material of the hard mask film 4, it is preferable to use, a chromium-based material containing chromium and having sufficient etch selectivity with respect to the light shielding film 3 for the dry etching using the fluorine-based gas.

For example, the chromium-based material forming the hard mask film 4 may be a chromium compound containing chromium and one or more elements selected from elements, such as oxygen, hydrogen, nitrogen, oxygen, boron, and so on, added thereto. The hard mask film 4 is patterned by dry etching using, as a mask, a pattern of the resist film formed on a surface of the mask blank 10 and using a mixture of a chlorine-based gas and an oxygen gas. Therefore, the hard mask film preferably has a high etching rate in the dry etching using the mixture of the chlorine-based gas and the oxygen gas. In this point of view, the hard mask film 4 is preferably made of a material at least containing chromium and oxygen. More preferably, the hard mask film 4 comprises a single-layer film formed by using the same material as the etching stopper film 2. In this case, a surface of the hard mask film 4 that faces away from the transparent substrate 1 and a region adjacent to the surface become a single-layer film having a composition gradient portion increased in oxygen content because a progress of oxidation is inevitable.

Although a method for forming the hard mask film 4 is not particularly limited, sputtering film formation is preferable among others. The sputtering film formation is favorable because a uniform film with a constant thickness can be formed. Since a highly conductive target is used in formation of the hard mask film 4, it is more preferable to use DC sputtering having a relatively high film formation rate.

The thickness of the hard mask film 4 is not particularly limited. However, the hard mask film 4 serves as an etching mask when the light shielding film 3 directly thereunder is patterned by the dry etching using the fluorine-based gas and, therefore, is desirable to have a thickness at least to the extent that the hard mask film does not disappear before completion of etching of the light shielding film 3 directly thereunder. On the other hand, if the thickness of the hard mask film 4 is too large, it is difficult to thin a resist film pattern directly thereon. From this point of view, the thickness of the hard mask film 4 is preferably within a range, for example, not smaller than 3 nm and not greater than 15 nm, more preferably not smaller than 3.5 nm and not greater than 10 nm.

Although not shown in FIG. 1, the mask blank of this disclosure includes a configuration in which a resist film is formed on the surface of the mask blank 10 having the structure mentioned above.

The resist film is made of an organic material which is preferably a resist material for electron beam writing. In particular, a chemically amplified resist material is preferably used.

Generally, the resist film is formed on the surface of the mask blank by a coating method such as spin coating. In view of fine pattern formation, the resist film preferably has a thickness of, for example, 200 nm or less. By provision of the hard mask film 4, the resist film can further be thinned, for example, to a thickness of 100 nm or less.

According to the mask blank 10 of this embodiment having the configuration described above, the mask blank has the structure in which the etching stopper film 2 made of the chromium-based material according to the configuration of this disclosure, the light shielding film (pattern-forming thin film) 3 made of the silicon-based material or the tantalum-based material, and the hard mask film 4 are laminated on the transparent substrate 1 in this order. Even in case where the etching stopper film 2 is patterned by the dry etching in the high-bias condition using, as a mask, the light shielding film 3 provided with the transfer pattern and using the mixture of the chlorine-based gas and the oxygen gas, it is possible to reduce a side etching amount generated on a pattern side wall of the etching stopper film 2. Thus, it is possible to suppress collapse of the transfer pattern due to thinning of the pattern of the etching stopper film 2 and to accurately form a fine transfer pattern.

Accordingly, the mask blank of this disclosure is particularly preferable in case where it is required to form a fine pattern (for example, a SRAF (Sub Resolution Assist Features) pattern having a size of 50 nm or less) with high pattern accuracy.

This disclosure also provides a method for manufacturing a transfer mask prepared from the above-mentioned mask blank according to this disclosure.

FIGS. 3A-3D are schematic sectional views for illustrating a manufacturing process of a transfer mask using the mask blank according to the first embodiment described above.

On the surface of the mask blank 10, the resist film for electron beam writing is formed by, for example, spin coating to a predetermined thickness. A predetermined pattern is written on the resist film by electron beam writing and, after writing, developed to thereby form a predetermined resist film pattern 6a (see FIG. 3A). The resist film pattern 6a has a desired device pattern to be formed on the light shielding film 3 and to serve as a final transfer pattern.

Figure 3A:
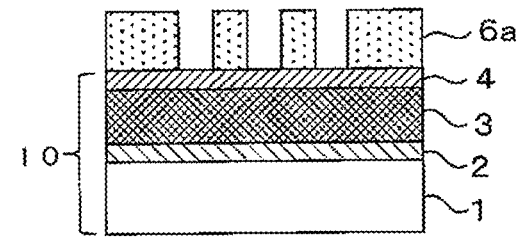
FIGS. 3A-3D are schematic sectional views for illustrating a manufacturing process of a transfer mask using the mask blank according to the first embodiment of this disclosure.
Figure 3B:
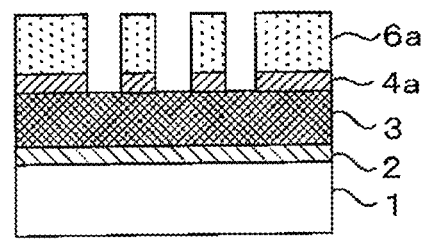

Next, by dry etching using the resist film pattern 6a as a mask and using a mixture of a chlorine-based gas and an oxygen gas, a hard mask film pattern 4a is formed on the hard mask film 4 made of the chromium-based material (see FIG. 3B).

Figure 3C:
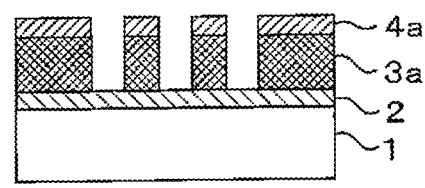

Next, after the remaining resist film pattern 6a is removed, a light shielding film pattern 3a is formed on the light shielding film 3 made of the silicon-based material or the tantalum-based material through dry etching using the hard mask film pattern 4a as a mask and using a fluorine-based gas (see FIG. 3C).

Figure 3D:
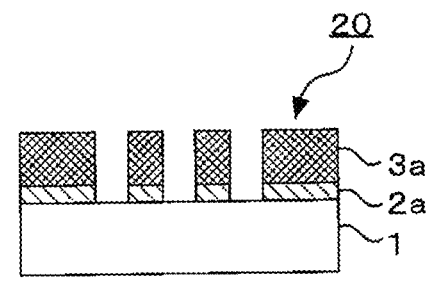

Next, through dry etching using a mixture of a chlorine-based gas and an oxygen gas, the hard mask film pattern 4a is removed and, simultaneously, a pattern 2a is formed on the etching stopper film 2 made of the chromium-based material according to the configuration of this disclosure (see FIG. 3D). According to this disclosure, in this case, it is preferable to apply the above-mentioned dry etching in the high-bias condition.

By using the mask blank 10 according to this embodiment, it is possible to suppress side etching caused on the pattern side wall of the etching stopper film 2 when the etching stopper film 2 is patterned by dry etching using the mixture of the chlorine-based gas and the oxygen gas. Consequently, it is possible to suppress collapse of the transfer pattern (the light shielding film pattern 3a) due to thinning of the pattern 2a of the etching stopper film 2 and to accurately form even a fine transfer pattern.

In the above-mentioned manner, the transfer mask 20 of a binary type is completed in which the fine light shielding film pattern 3a to serve as a transfer pattern is formed on the transparent substrate 1. Thus, by using the mask blank 10 of this embodiment, it is possible to manufacture the transfer mask 20 provided with a high-accuracy fine transfer pattern.

According to a method of manufacturing a semiconductor device, which includes a step of exposure-transferring, using the transfer mask 20 manufactured using the mask blank of this embodiment, the transfer pattern of the transfer mask onto a resist film on a semiconductor substrate by lithography, it is possible to manufacture a high-quality semiconductor device provided with a device pattern excellent in pattern accuracy.

In the foregoing embodiment, this disclosure is applied to the binary mask blank and description has been made about the transfer mask of a binary type manufactured using the binary mask blank of this embodiment. However, using a mask blank of a structure similar to that of the mask blank 10 of the foregoing embodiment, it is possible to manufacture, for example, a phase shift mask of a substrate eroded type (for example, an eroded Levenson type phase shift mask, a chromeless phase shift mask, and so on). Thus, the mask blank of this embodiment may be used as a mask blank for use in preparation of the above-mentioned phase shift mask.

Second Embodiment

Figure 2:
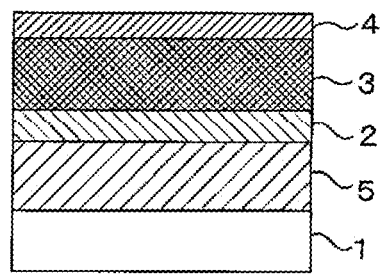
FIG. 2 is a schematic sectional view of a mask blank according to a second embodiment of this disclosure.

FIG. 2 is a schematic sectional view for illustrating a mask blank according to a second embodiment of this disclosure.

As shown in FIG. 2, the mask blank 30 according to the second embodiment of this disclosure is a phase shift mask blank having a structure in which a phase shift film 5, an etching stopper film 2, a light shielding film 3 made of a silicon-based material or a tantalum-based material, and a hard mask film 4 made of a chromium-based material are laminated on a transparent substrate 1 in this order.

In this embodiment also, the etching stopper film 2 has the configuration of this disclosure. Specifically, the etching stopper film 2 of this embodiment is made of a material containing chromium, oxygen, and carbon and has a chromium content of 50 atomic % or more. The etching stopper film 2 has a maximum peak of N1s narrow spectrum, obtained by analysis of X-ray photoelectron spectroscopy, which is not higher than a lower detection limit. The etching stopper film has a maximum peak of Cr2p narrow spectrum, obtained by analysis of X-ray photoelectron spectroscopy, at a binding energy of 574 eV or less. The details of the etching stopper film 2 in this embodiment are similar to those in case of the etching stopper film in the first embodiment mentioned above and, therefore, overlapping description will be omitted herein.

Details of the transparent substrate 1, the light shielding film 3, and the hard mask film 4 of the mask blank 30 in this embodiment are also similar to those in case of the first embodiment and, therefore, overlapping description will be omitted herein.

As a method for forming the etching stopper film 2, the light shielding film 3, and the hard mask film 4 in the mask blank 30 of this embodiment, sputtering film formation is preferable, like in case of the first embodiment. The thickness of each film is also similar to that in case of the first embodiment. In this embodiment, however, in a laminated structure of the phase shift film 5, the etching stopper film 2, and the light shielding film 3, an optical density (OD) with respect to, for example, exposure light of an ArF excimer laser (wavelength: 193 nm) is required to be 2.8 or more, more preferably 3.0 or more.

The phase shift film 5 is made of a material containing silicon. A configuration of the phase shift film 5 applied in this embodiment need not be particularly limited. For example, it is possible to apply configurations of phase shift films in phase shift masks which have heretofore been used.

The phase shift film 5 is made of, for example, a material containing silicon, a material containing transition metal and silicon, and, furthermore, a material further containing at least one element selected from nitrogen, oxygen, and carbon in order to improve optical characteristics (light transmittance, phase difference, and so on) of the film, physical properties (etching rate, etch selectivity with respect to another film (layer)) of the film.

Specifically, as the material containing silicon, a material containing nitride, oxide, carbide, oxynitride (oxide nitride), carboxide (carbide oxide), or carboxynitride (carbide oxide nitride) of silicon is preferable.

Specifically, as the material containing transition metal and silicon, a material containing transition metal silicide consisting of transition metal and silicon, or nitride, oxide, carbide, oxynitride, carboxide, or carboxynitride of transition metal silicide is preferable. As the transition metal, molybdenum, tantalum, tungsten, titanium, chromium, hafnium, nickel, vanadium, zirconium, ruthenium, rhodium, niobium, and so on are applicable. Among others, molybdenum is particularly preferable.

The phase shift film 5 may be applied in any of a single-layer structure or a laminated structure comprising a low-transmittance layer and a high-transmittance layer.

A preferred thickness of the phase shift film 5 is different depending on the material thereof but is desired to be appropriately adjusted in view of a phase shift function and a light transmittance. The thickness of the phase shift film 5 is generally in a range of, for example, 100 nm or less, more preferably 80 nm or less. Although a method for forming the phase shift film 5 is not particularly limited, sputtering film formation is preferable.

Although not shown in FIG. 2, the mask blank of this disclosure includes a configuration in which a resist film is formed on a surface of the mask blank 30 having the structure mentioned above. The resist film is similar to that in case of the first embodiment mentioned above.

Next, description will be made about a method for manufacturing a transfer mask using the mask blank 30 in the second embodiment.

FIGS. 4A-4G are schematic sectional views for illustrating a manufacturing process of the transfer mask (halftone phase shift mask) using the mask blank 30 according to the second embodiment mentioned above.

At first, on the surface of the mask blank 30, the resist film for electron beam writing is formed by, for example, spin coating to a predetermined thickness.

Figure 4A:
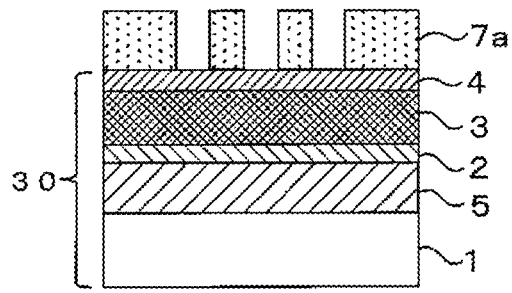
FIGS. 4A-4G are schematic sectional views for illustrating a manufacturing process of a transfer mask using the mask blank according to the second embodiment of this disclosure.

A predetermined pattern is written on the resist film by electron beam writing and, after writing, developed to thereby form a predetermined resist film pattern 7a (see FIG. 4A). The resist film pattern 7a has a desired device pattern to be formed on the phase shift film 5 and to serve as a final transfer pattern.

Figure 4E:
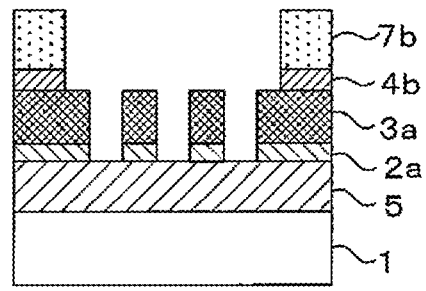
Figure 4B:
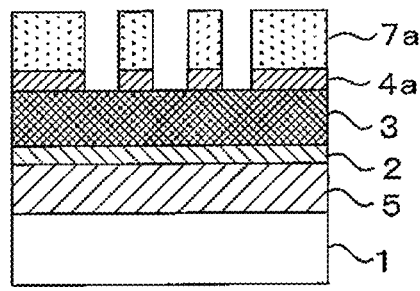

Next, by dry etching using the resist film pattern 7a as a mask and using a mixture of a chlorine-based gas and an oxygen gas, a hard mask film pattern 4a is formed on the hard mask film 4 made of the chromium-based material (see FIG. 4B).

Figure 4F:
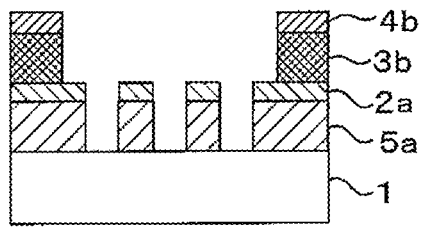
Figure 4C:
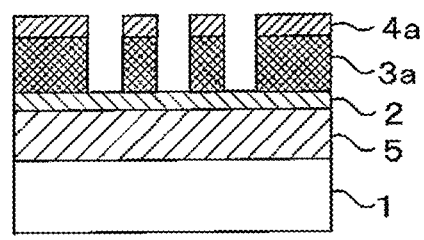

Next, after removing the remaining resist film pattern 7a, a light shielding film pattern 3a is formed on the light shielding film 3 made of the silicon-based material or the tantalum-based material by dry etching using the hard mask film pattern 4a as a mask and using a fluorine-based gas (see FIG. 4C).

Next, a resist film similar to that mentioned above is formed on an entire surface of the mask blank provided with the light shielding film pattern 3a mentioned above. A predetermined light shielding pattern (for example, a light shielding zone pattern) is written on the resist film and, after writing, developed to thereby form a resist film pattern 7b having a predetermined light shielding pattern on the hard mask film 4 (hard mask film pattern 4a) (see FIG. 4D).

Next, through dry etching using a mixture of a chlorine-based gas and an oxygen gas, a pattern 2a is formed on the etching stopper film 2 made of the chromium-based material according to the configuration of this disclosure by using, as a mask, the light shielding film pattern 3a formed on the light shielding film 3 and, simultaneously, a pattern 4b having the above-mentioned light shielding pattern is formed on the hard mask film 4 by using the resist film pattern 7b as a mask (see FIG. 4E). In this disclosure, the above-mentioned dry etching in the high-bias condition is preferably applied in this case.

Next, after the resist film pattern 7b is removed, through dry etching using a fluorine-based gas, a phase shift film pattern 5a is formed on the phase shift film 5 by using, as a mask, the pattern 2a formed on the etching stopper film 2 and, simultaneously, a part of the light shielding pattern 3a of the light shielding film is removed by using the hard mask film pattern 4b as a mask to form a light shielding film pattern 3b (see FIG. 4F).

Figure 4G:
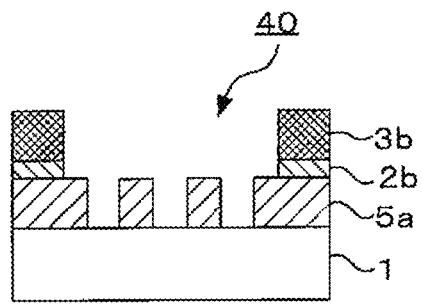
Figure 4D:
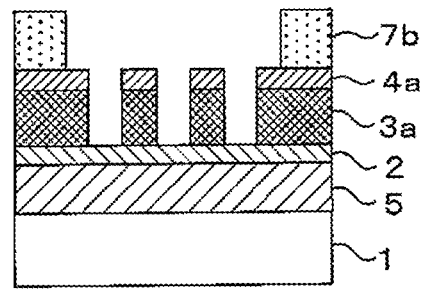

Next, through dry etching using a mixture of a chlorine-based gas and an oxygen gas, a pattern 2b having a light shielding pattern is formed on the etching stopper film 2 (pattern 2a) by using, as a mask, the light shielding film pattern 3b provided with the light shielding pattern and, simultaneously, the remaining hard mask film pattern 4b is removed (see FIG. 4G).

In the above-mentioned manner, a halftone phase shift mask (transfer mask) 40 is completed in which a fine pattern 5a of the phase shift film to serve as a transfer pattern and the light shielding pattern (light shielding zone pattern) in an outer peripheral region are formed on the transparent substrate 1 (see FIG. 4G).

By using the mask blank 30 according to this embodiment, it is possible to suppress side etching caused on the pattern side wall of the etching stopper film 2 when the etching stopper film 2 is patterned by dry etching using the mixture of the chlorine-based gas and the oxygen gas (the step in FIG. 4E). Consequently, it is possible to suppress collapse of the light shielding film pattern 3a due to thinning of the pattern 2a of the etching stopper film 2 and to accurately form even a fine transfer pattern. Furthermore, by patterning the phase shift film 5 with the pattern 2a of the etching stopper film 2 used as a mask (the step in FIG. 4F), it is also possible to accurately form a fine transfer pattern on the phase shift film 5.

Thus, by using the mask blank 30 of this embodiment, it is possible to manufacture the transfer mask (halftone phase shift mask) 40 provided with a high-accuracy fine transfer pattern.

According to a method for manufacturing a semiconductor device, having a step of exposure-transferring, using the transfer mask 40 manufactured from the mask blank 30 of this embodiment, the transfer pattern of the transfer mask onto a resist film on a semiconductor substrate by lithography, it is possible to manufacture a high-quality semiconductor device provided with a device pattern excellent in pattern accuracy.

Hereinafter, the embodiments of this disclosure will more specifically be described with reference to examples.

Example 1

Example 1 relates to a mask blank for use in manufacture of a transfer mask (binary mask) using an ArF excimer laser having a wavelength of 193 nm as exposure light, and to manufacture of the transfer mask. This example corresponds to the first embodiment mentioned above.

A mask blank 10 used in Example 1 has a structure in which an etching stopper film 2, a light shielding film 3, and a hard mask film 4 are laminated on a transparent substrate 1 in this order, as illustrated in FIG. 1. The mask blank 10 was manufactured as follows.

The transparent substrate 1 (having a size of about 152 mm×152 mm×thickness of about 6.35 mm) made of synthetic quartz glass was prepared. In the transparent substrate 1, a main surface and an end face are polished to a predetermined surface roughness (for example, the main surface has a root mean square roughness Rq of 0.2 nm or less).

At first, the transparent substrate 1 was placed in a single-wafer DC sputtering apparatus. Using a target of chromium and in a mixture atmosphere of argon (Ar), carbon dioxide ($CO_2$), and helium (He), reactive sputtering was carried out to form the etching stopper film 2 comprising a CrOC film containing chromium, oxygen, and carbon on the main surface of the transparent substrate 1 to a thickness of 10 nm.

Next, the transparent substrate 1 provided with the etching stopper film 2 is placed in the single-wafer DC sputtering apparatus. Through DC sputtering using a mixed target of molybdenum (Mo) and silicon (Si) (Mo:Si=13 atomic %:87 atomic %) and using a mixture of nitrogen ($N_2$) and argon (Ar) as a sputtering gas, a lower layer of the light shielding film comprising an MoSiN film containing molybdenum, silicon, and nitrogen (Mo: 9.2 atomic %, Si: 68.3 atomic %, N: 22.5 atomic %) was formed to a thickness of 47 nm in contact with a surface of the etching stopper film 2. Subsequently, through DC sputtering using an MoSi mixed target same as that mentioned above and using a mixture of nitrogen ($N_2$) and argon (Ar), an upper layer of the light shielding film comprising an MoSiN film containing molybdenum, silicon, and nitrogen (Mo: 5.8 atomic %, Si: 64.4 atomic %, N: 27.7 atomic %) was formed on the lower layer of the light shielding film to a thickness of 4 nm. Thus, the MoSi-based light shielding film 3 having a double-layer structure with a total thickness of 51 nm was formed. The MoSi-based light shielding film 3 as a laminated film thus formed had an optical density of 3.0 or more at a wavelength (193 nm) of the ArF excimer laser.

Next, the transparent substrate 1 provided with the etching stopper film 2 and the light shielding film 3 was placed in the single wafer DC sputtering apparatus. Using a target of chromium, DC sputtering by a mixture of argon (Ar), carbon dioxide ($CO_2$), and helium (He) was carried out in a film forming condition same as that when the etching stopper film 2 was formed. Consequently, the hard mask film 4 comprising a CrOC film containing chromium, oxygen, and carbon was formed on a surface of the light shielding film 3 to the thickness of 10 nm.

In the above-mentioned manner, the mask blank 10 according to Example 1 was manufactured.

An item was prepared in which only the etching stopper film 2 mentioned above was formed on a surface of another transparent substrate in the same condition as mentioned above. The etching stopper film 2 was analyzed by X-ray photoelectron spectroscopy (with RBS (Rutherford Backscattering Spectroscopy) correction). As a result, it was confirmed that the contents of the respective constituent elements in the etching stopper film 2 were Cr: 71 atomic %, O: 15 atomic %, and C: 14 atomic % in average. Furthermore, it was confirmed that, in the etching stopper film 2, a difference in content of each constituent element in the thickness direction was 3 atomic % or less (except a region near the surface of the etching stopper film 2 where an analysis result is subject to an influence of air) and there was no substantial composition gradient in the thickness direction. Similarly, an item was prepared in which only the hard mask film 4 was formed on a main surface of another transparent substrate in the same condition as mentioned above. The hard mask film 4 was analyzed by X-ray photoelectron spectroscopy (with RBS (Rutherford Backscattering Spectroscopy) correction). As a result, it was confirmed that a composition was similar to that in case of the etching stopper film 2.

Figure 6:
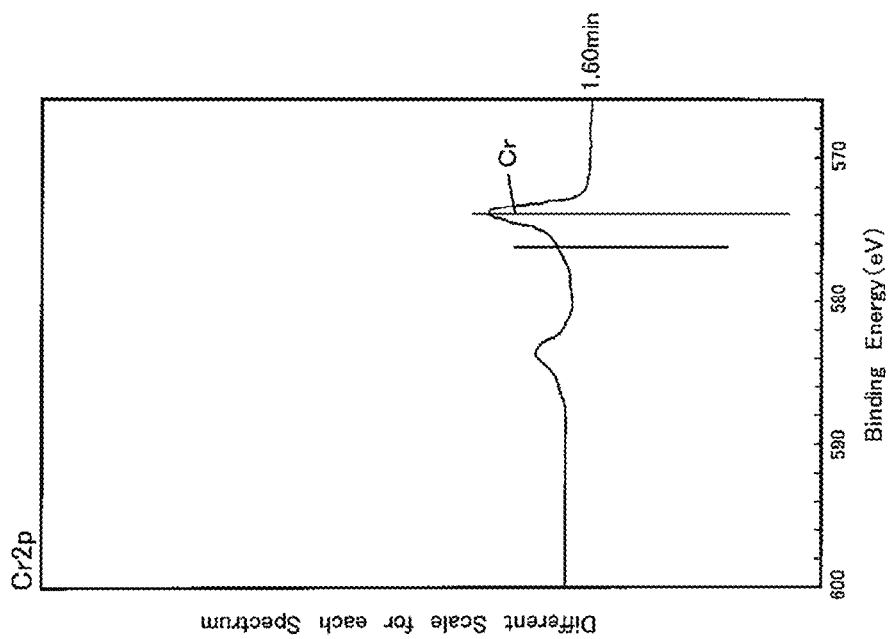
FIG. 6 is a view for illustrating a Cr2p narrow spectrum obtained by analyzing a hard mask film of a mask blank according to Example 1 of this disclosure by X-ray photoelectron spectroscopy (XPS)
Figure 7:
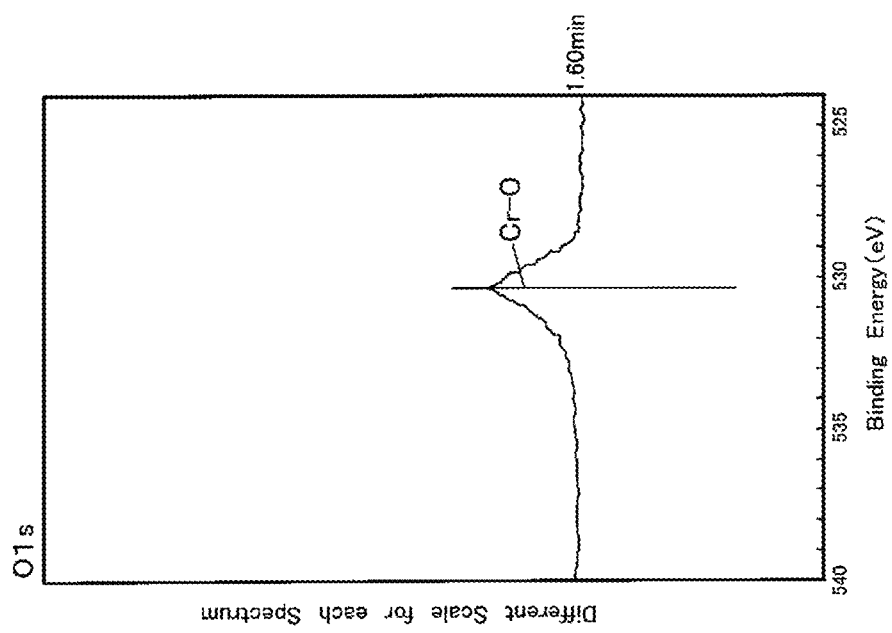
FIG. 7 is a view for illustrating an O1s narrow spectrum obtained by analyzing the hard mask film of the mask blank according to Example 1 of this disclosure by X-ray photoelectron spectroscopy (XPS)
Figure 8:
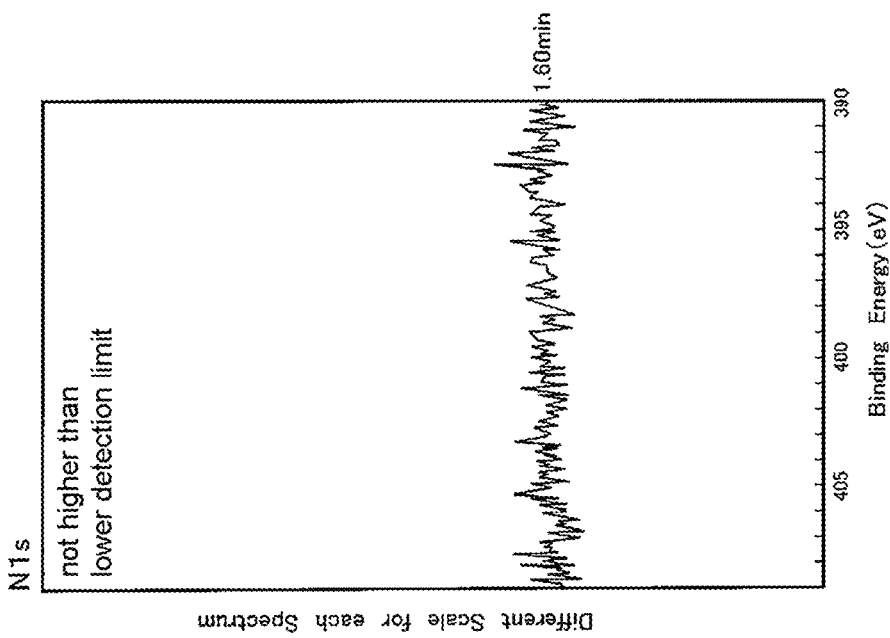
FIG. 8 is a view for illustrating an N1s narrow spectrum obtained by analyzing the hard mask film of the mask blank according to Example 1 of this disclosure by X-ray photoelectron spectroscopy (XPS)
Figure 9:
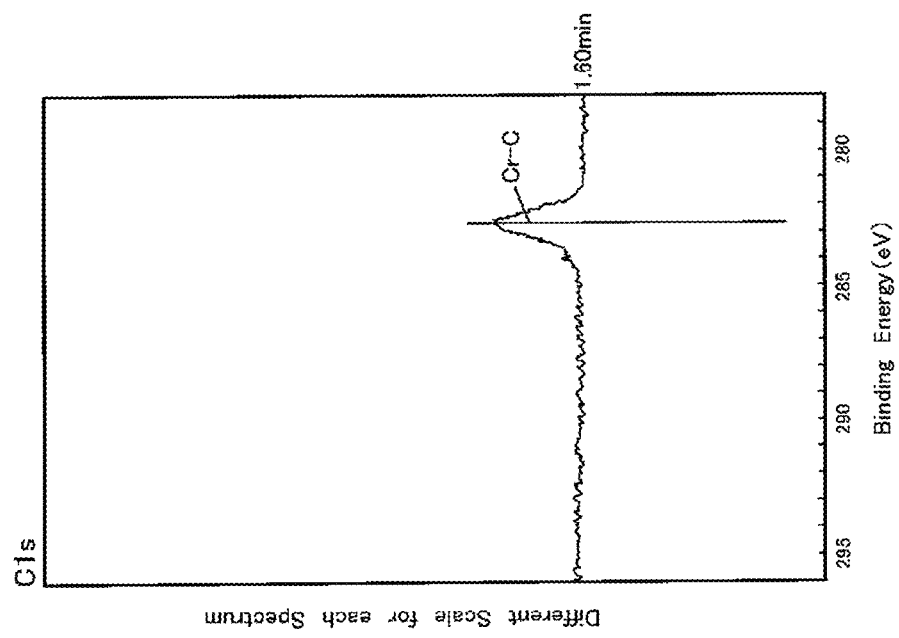
FIG. 9 is a view for illustrating a C1s narrow spectrum obtained by analyzing the hard mask film of the mask blank according to Example 1 of this disclosure by X-ray photoelectron spectroscopy (XPS)
Figure 10:
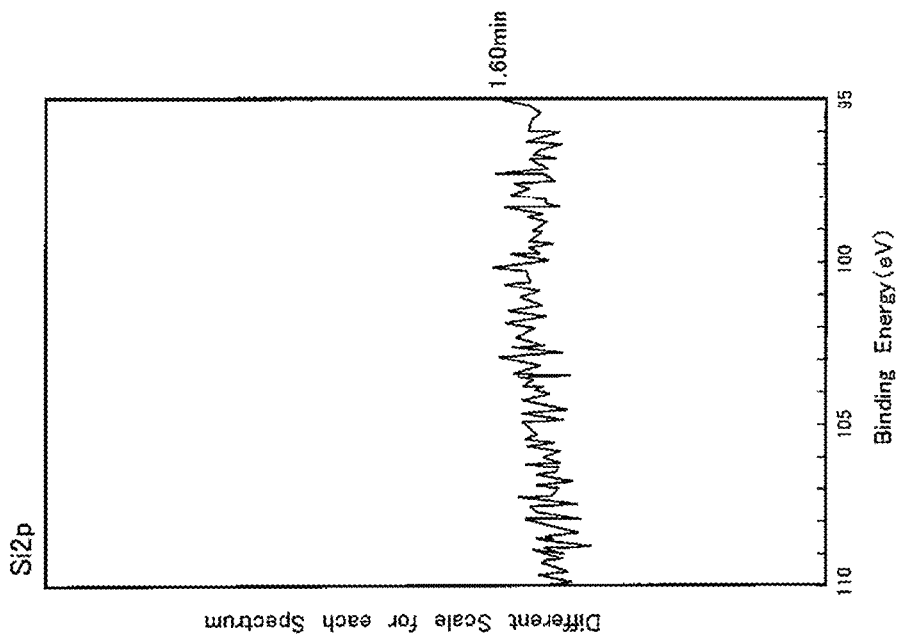
FIG. 10 is a view for illustrating an Si2p narrow spectrum obtained by analyzing the hard mask film of the mask blank according to Example 1 of this disclosure by X-ray photoelectron spectroscopy (XPS)

FIG. 6 shows a result of depth direction chemical bonding state analysis of Cr2p narrow spectrum, obtained by analysis on the etching stopper film 2 of Example 1 formed on another transparent substrate 1 by X-ray photoelectron spectroscopy. FIG. 7 shows a result of depth direction chemical bonding state analysis of O1s narrow spectrum. FIG. 8 shows a result of depth direction chemical bonding state analysis of N1s narrow spectrum. FIG. 9 shows a result of depth direction chemical bonding state analysis of C1s narrow spectrum. FIG. 10 shows a result of depth direction chemical bonding state analysis of Si2p narrow spectrum.

In the analysis on the etching stopper film 2 by X-ray photoelectron spectroscopy, the etching stopper film 2 is analyzed in the film thickness direction by repeating the steps of at first radiating X-ray towards the surface of the etching stopper film 2 to measure energy distribution of photoelectrons emitted from the etching stopper film 2, then eroding the etching stopper film 2 by Ar gas sputtering for a predetermined time duration, and radiating X-ray to the surface of the etching stopper film 2 in an eroded region to measure energy distribution of photoelectrons emitted from the etching stopper film 2. In Example 1, the analysis of X-ray photoelectron spectroscopy was carried out using monochromatized Al (1486.6 eV) as an X-ray source in a condition that a photoelectron detection area was 100 μmϕ and a detection depth was about 4 to 5 nm (takeoff angle: 45 deg) (the same applies to examples and comparative examples hereinafter).

In each depth direction chemical bonding state analysis in FIGS. 6 to 10, a plot "1.60 min" in each figure shows an analysis result at a position in the film thickness direction of the etching stopper film 2 after eroding the etching stopper film 2 from the uppermost surface for 1.60 min by Ar gas sputtering.

The position in the film thickness direction of the etching stopper film 2 after eroding the etching stopper film 2 from the uppermost surface for 1.60 min by Ar gas sputtering is a position at a depth of about 6 nm from the surface. The plot "1.60 min" is a measurement result at the position of that depth.

In the narrow spectra in FIGS. 6 to 10, scales on the vertical axis are not same. In N1s narrow spectrum in FIG. 8 and Si2p narrow spectrum in FIG. 10, the scales on the vertical axis are enlarged as compared with the narrow spectra in FIGS. 6, 7, and 9. Therefore, a wave of vibration in each of N1s narrow spectrum in FIG. 8 and Si2p narrow spectrum in FIG. 10 does not represent presence of a peak but represents noise.

From the analysis result of Cr2p narrow spectrum in FIG. 6, it is understood that the etching stopper film 2 in Example 1 has a maximum peak at a binding energy of 574 eV. The above-mentioned result means that chromium atoms which are not bonded to atoms such as oxygen exist in the etching stopper film 2 at a predetermined ratio or more.

From the result of O1s narrow spectrum in FIG. 7, it is understood that the etching stopper film 2 in Example 1 has a maximum peak at a binding energy of about 530 eV. The above-mentioned result means that Cr—O bond exists in the etching stopper film 2 at a predetermined ratio or more.

From the analysis result of N1s narrow spectrum in FIG. 8, it is understood that the etching stopper film 2 in Example 1 has a maximum peak which is not higher than a detection lower limit. The above-mentioned result means that atoms bonded to nitrogen, including Cr—N bond, were not detected in the etching stopper film 2.

From the result of C1s narrow spectrum in FIG. 9, it is understood that the etching stopper film 2 in Example 1 has a maximum peak at a binding energy of 282 eV to 283 eV. The above-mentioned result means that Cr—C bond exists in the etching stopper film 2 at a predetermined ratio or more.

From the analysis result of Si2p narrow spectrum in FIG. 10, it is understood that, in the etching stopper film 2 in Example 1, the maximum peak is not higher than the detection lower limit. The above-mentioned result means that atoms bonded to silicon, including Cr—Si bond, were not detected in the etching stopper film 2.

Next, using the mask blank 10, a transfer mask (binary mask) was manufactured according to the above-mentioned manufacturing process illustrated in FIGS. 3A-3D. The following reference numerals correspond to those in FIGS. 3A-3D.

At first, a chemically amplified resist for electron beam writing (PRL009 manufactured by Fuji Film Electronics Materials Co. Ltd.) was applied onto an upper surface of the above-mentioned mask blank 10 by spin coating and subjected to predetermined baking to form a resist film having a thickness of 80 nm.

Next, using an electron beam writing apparatus, a predetermined device pattern (pattern corresponding to a transfer pattern to be formed on the light shielding film 3) was written on the resist film and, thereafter, the resist film was developed to form a resist film pattern 6a (see FIG. 3A). The resist film pattern 6a includes a SRAF pattern having a line width of 50 nm.

Next, with the resist film pattern 6a used as a mask, the hard mask film 4 was dry etched by the above-mentioned dry etching in the high-bias condition to form a hard mask film pattern 4a (see FIG. 3B). The dry etching was carried out using, as an etching gas, a mixture of a chlorine gas ($Cl_2$) and an oxygen gas ($O_2$) ($Cl_2:O_2$=13:1 (flow rate ratio)) with a high bias such that the power upon application of a bias voltage was 50 W.

Next, after the above-mentioned resist film pattern 6a was removed, the light shielding film 3 of an MoSi-based double layer structure was dry etched with the hard mask film pattern 4a used as a mask to form a light shielding film pattern 3a (see FIG. 3C). As an etching gas, a fluorine-based gas ($CF_4$) was used.

Next, the etching stopper film 2 was etched through the above-mentioned dry etching in the high-bias condition with the light shielding film pattern 3a used as a mask to form a pattern 2a on the etching stopper film 2 and to remove the hard mask film pattern 4a (see FIG. 3D). The dry etching was carried out using a mixture of a chlorine gas ($Cl_2$) and an oxygen gas ($O_2$) ($Cl_2:O_2$:4:1 (flow rate ratio)) as an etching gas with a high bias such that the power upon application of a bias voltage was 50 W.

In the above-mentioned manner, the transfer mask (binary mask) 20 was completed which has a transfer pattern formed on the transparent substrate 1 and comprising a laminate of the pattern 2a of the etching stopper film and the light shielding film pattern 3a (see FIG. 3D).

By a process similar to that mentioned above, another transfer mask 20 of Example 1 was manufactured. A cross-section STEM (Scanning Transmission Electron Microscope) image of a region where a SRAF pattern is formed was acquired and a line width of each of the light shielding film pattern 3a and the pattern 2a of the etching stopper film was measured.

Then, an etching bias was calculated which was a variation amount between the line width of the light shielding film pattern 3a and the line width of the pattern 2a of the etching stopper film. As a result, the etching bias was about 6 nm which was significantly smaller than that in case of dry etching on a conventional chromium-based material film.

This shows that, also in case where the etching stopper film 2 is patterned by the dry etching in the high-bias condition using the light shielding film pattern 3a as a mask and using a mixture of a chlorine-based gas and an oxygen gas, it is possible to suppress the side etching caused on a pattern side wall of the etching stopper film 2. As a consequence, collapse of the light shielding film pattern 3a due to thinning of the pattern 2a of the etching stopper film 2 can be suppressed and that even a transfer pattern having a fine pattern such as a SRAF pattern with a line width of, for example, 50 nm or less can accurately be formed.

The above-mentioned transfer mask 20 thus obtained was subjected to inspection of the mask pattern by a mask inspection apparatus. As a result, it was confirmed that, without collapse of the pattern, the fine pattern was formed in an allowable range from a designed value.

As described above, by using the mask blank of Example 1, it is possible to manufacture the transfer mask 20 provided with a high-accuracy fine transfer pattern.

Furthermore, by using AIMS193 (manufactured by Carl Zeiss), the transfer mask 20 was subjected to simulation of an exposure transfer image when exposure transfer was carried out onto a resist film on a semiconductor device using exposure light having a wavelength of 193 nm. When the exposure transfer image obtained by the simulation was verified, a design specification was sufficiently satisfied. From the above, it is said that, when the transfer mask 20 manufactured from the mask blank of Example 1 is set in the exposure apparatus and is subjected to exposure transfer by the exposure light of the ArF excimer laser, exposure transfer can be carried out with high accuracy onto the resist film on the semiconductor device.

Example 2

A mask blank 10 in Example 2 was prepared in the manner similar to Example 1 except an etching stopper film 2. The etching stopper film 2 in Example 2 was formed in a film forming condition changed from that of the etching stopper film 2 in Example 1 as follows.

Specifically, a transparent substrate 1 same as that in Example 1 was placed in a single-wafer DC sputtering apparatus. Using a target comprising chromium, reactive sputtering was carried out in a mixture atmosphere of Argon (Ar), carbon dioxide ($CO_2$), and helium (He) so that the etching stopper film 2 comprising a CrOC film containing chromium, oxygen, and carbon was formed on a main surface of the transparent substrate 1 to the thickness of 10 nm.

Next, an MoSi-based light shielding film 3 was formed on the etching stopper film 2 under a condition same as that in Example 1.

Next, the transparent substrate 1 provided with the etching stopper film 2 and the light shielding film 3 was placed in the single-wafer DC sputtering apparatus. Using a target of chromium, DC sputtering by a mixture of argon (Ar), carbon dioxide ($CO_2$), and helium (He) was carried out in a film forming condition same as that when the etching stopper film 2 in Example 2 was formed. Consequently, the hard mask film 4 comprising a CrOC film containing chromium, oxygen, and carbon was formed on a surface of the light shielding film 3 to a thickness of 10 nm.

In the above-mentioned manner, the mask blank 10 of Example 2 was prepared.

An item was prepared in which only the etching stopper film 2 in Example 2 was formed on a main surface of another transparent substrate in the same condition as mentioned above. The etching stopper film 2 in Example 2 was analyzed by X-ray photoelectron spectroscopy (with RBS correction). As a result, it was confirmed that the contents of the respective constituent elements in the etching stopper film 2 were Cr: 55 atomic %, O: 30 atomic %, and C: 15 atomic % in average. Furthermore, it was confirmed that, in the etching stopper film 2, a difference in content of each constituent element in the thickness direction was 3 atomic % or less (except a region near a surface of the etching stopper film 2 where an analysis result is subject to an influence of air) and there was no substantial composition gradient in the thickness direction. Similarly, an item was prepared in which only the hard mask film 4 was formed on a main surface of another transparent substrate in the same condition as mentioned above. The hard mask film 4 was analyzed by X-ray photoelectron spectroscopy (with RBS correction). As a result, it was confirmed that a composition was similar to that in case of the etching stopper film 2.

Figure 11:
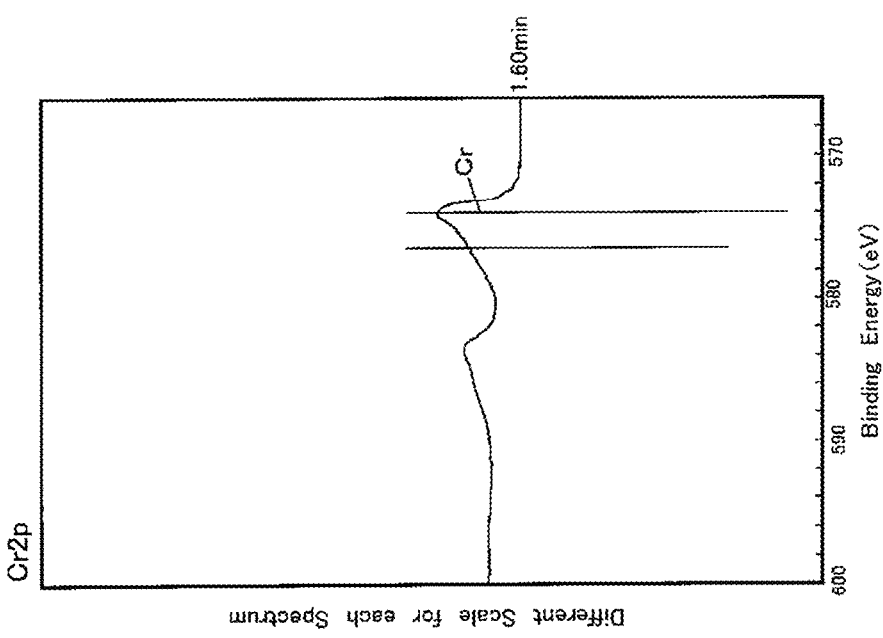
FIG. 11 is a view for illustrating a Cr2p narrow spectrum obtained by analyzing a hard mask film of a mask blank according to Example 2 of this disclosure by X-ray photoelectron spectroscopy (XPS)
Figures 12, 13:
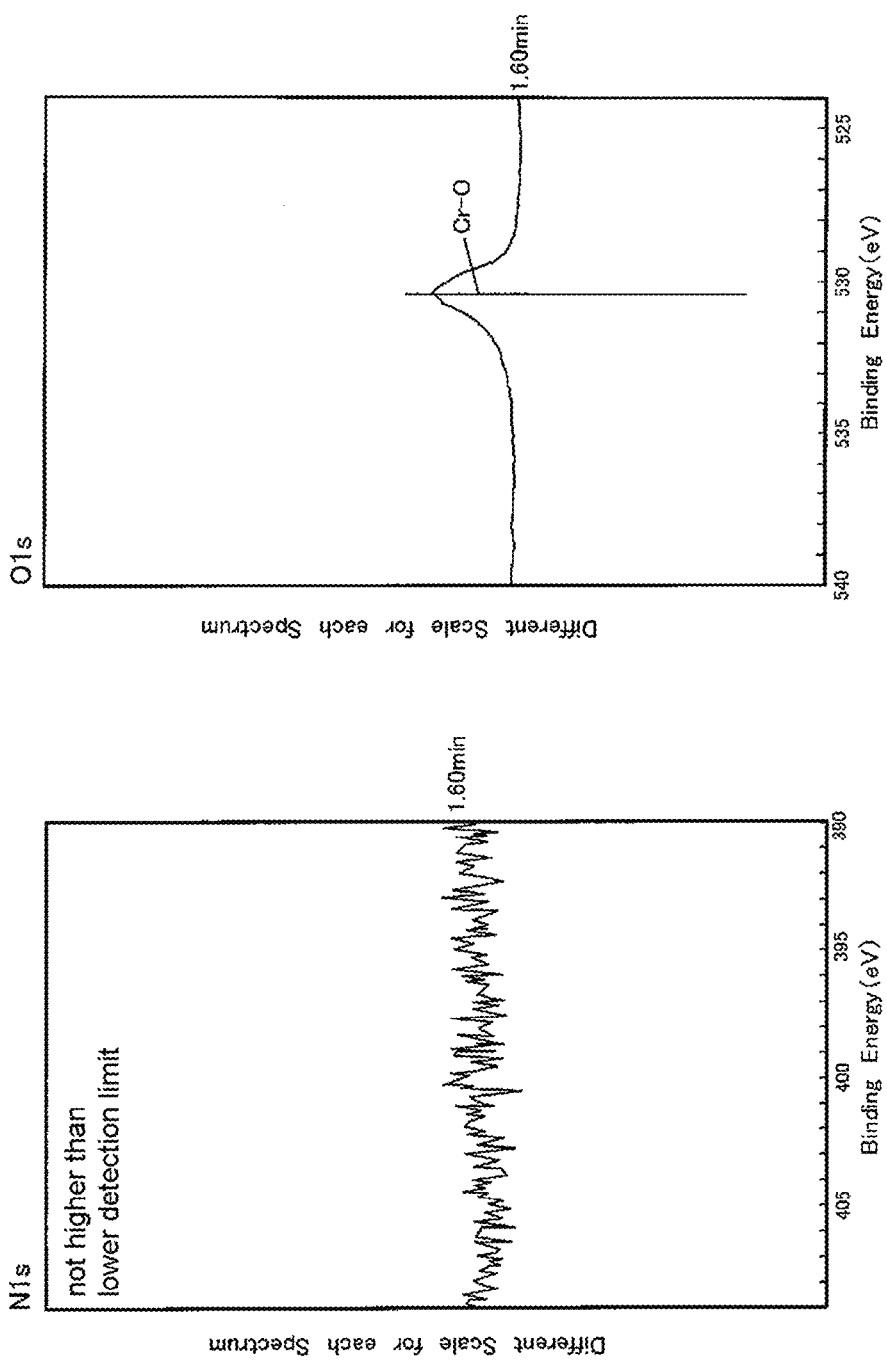
FIG. 12 is a view for illustrating an O1s narrow spectrum obtained by analyzing the hard mask film of the mask blank according to Example 2 of this disclosure by X-ray photoelectron spectroscopy (XPS)
FIG. 13 is a view for illustrating an N1s narrow spectrum obtained by analyzing the hard mask film of the mask blank according to Example 2 of this disclosure by X-ray photoelectron spectroscopy (XPS)
Figure 14:
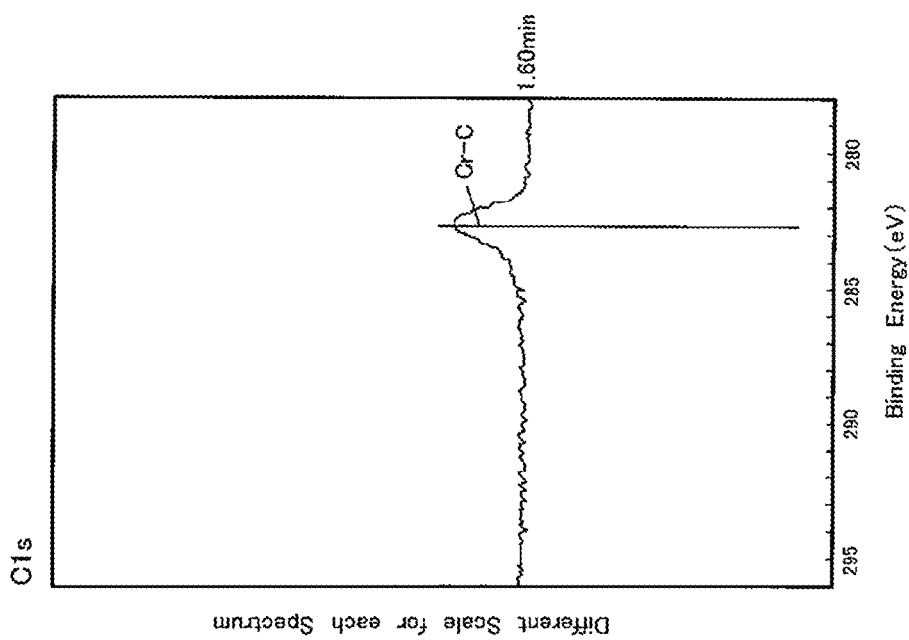
FIG. 14 is a view for illustrating a C1s narrow spectrum obtained by analyzing the hard mask film of the mask blank according to Example 2 of this disclosure by X-ray photoelectron spectroscopy (XPS)
Figure 15:
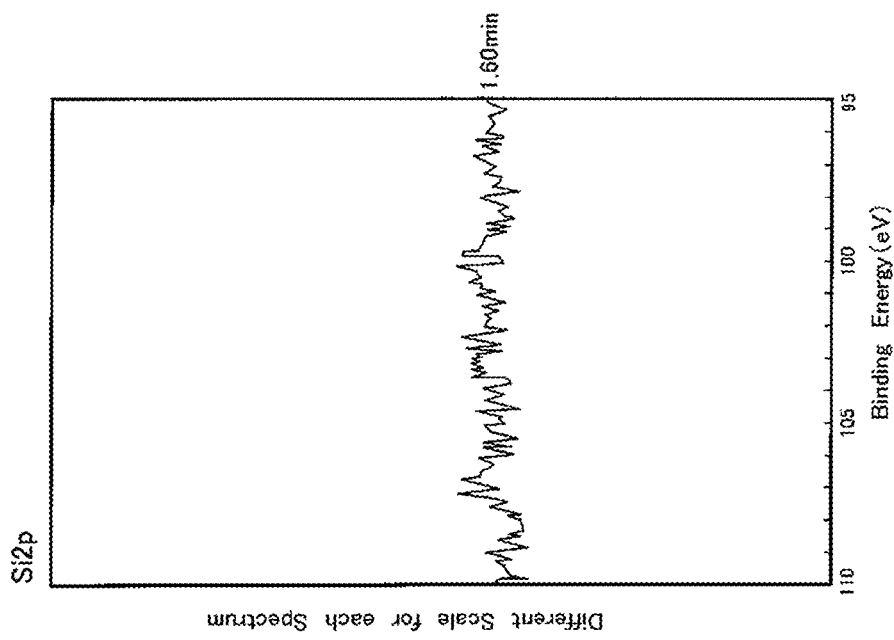
FIG. 15 is a view for illustrating an Si2p narrow spectrum obtained by analyzing the hard mask film of the mask blank according to Example 2 of this disclosure by X-ray photoelectron spectroscopy (XPS)

In the manner similar to Example 1, FIG. 11 shows a result of depth direction chemical bonding state analysis of Cr2p narrow spectrum, obtained by analysis on the etching stopper film 2 of Example 2 formed on another transparent substrate 1 by X-ray photoelectron spectroscopy. FIG. 12 shows a result of depth direction chemical bonding state analysis of O1s narrow spectrum. FIG. 13 shows a result of depth direction chemical bonding state analysis of N1s narrow spectrum. FIG. 14 shows a result of depth direction chemical bonding state analysis of C1s narrow spectrum. FIG. 15 shows a result of depth direction chemical bonding state analysis of Si2p narrow spectrum.

In each depth direction chemical bonding state analysis in FIGS. 11 to 15, a plot "1.60 min" in each figure shows an analysis result at a position in the film thickness direction of the etching stopper film 2 after eroding the etching stopper film 2 from the uppermost surface for 1.60 min by Ar gas sputtering.

In the narrow spectra in FIGS. 11 to 15, scales on the vertical axis are not same. In N1s narrow spectrum in FIG. 13 and the Si2p narrow spectrum in FIG. 15, the scales on the vertical axis are enlarged as compared with the narrow spectra in FIGS. 11, 12, and 14. Therefore, a wave of vibration in each of N1s narrow spectrum in FIG. 13 and Si2p narrow spectrum in FIG. 15 does not represent presence of a peak but represents noise.

From the analysis result of Cr2p narrow spectrum in FIG. 11, it is understood that the etching stopper film 2 in Example 2 has a maximum peak at a binding energy of 574 eV. The above-mentioned result means that chromium atoms which are not bonded to atoms such as oxygen exist in the etching stopper film 2 at a predetermined ratio or more.

From the analysis result of O1s narrow spectrum in FIG. 12, it is understood that the etching stopper film 2 in Example 2 has a maximum peak at a binding energy of about 530 eV. The above-mentioned result means that Cr—O bond exists in the etching stopper film 2 at a predetermined ratio or more.

From the analysis result of N1s narrow spectrum in FIG. 13, it is understood that the etching stopper film 2 in Example 2 has a maximum peak which is not higher than a detection lower limit. The above-mentioned result means that atoms bonded to nitrogen, including Cr—N bond, were not detected in the etching stopper film 2.

From the analysis result of C1s narrow spectrum in FIG. 14, it is understood that the etching stopper film 2 in Example 2 has a maximum peak at a binding energy of 282 eV to 283 eV. The above-mentioned result means that Cr—C bond exists in the etching stopper film 2 at a predetermined amount or more.

From the result of Si2p narrow spectrum in FIG. 15, it is understood that, in the etching stopper film 2 in Example 2, the maximum peak is not higher than the detection lower limit. The above-mentioned result means that atoms bonded to silicon, including Cr—Si bond, were not detected in the etching stopper film 2.

Next, using the mask blank 10 in Example 2, a transfer mask (binary mask) 20 having a transfer pattern formed on the transparent substrate 1 and comprising a laminate of a pattern 2a of the etching stopper film 2 and a light shielding film pattern 3a was manufactured according to a manufacturing process similar to that in Example 1 mentioned above.

By the procedure similar to Example 1, another transfer mask 20 of Example 2 was manufactured. A cross-section STEM image of a region where a SRAF pattern was formed was acquired and a line width of each of the light shielding film pattern 3a and the pattern 2a of the etching stopper film 2 was measured.

Then, an etching bias was calculated which was a variation amount between the line width of the light shielding film pattern 3a and the line width of the pattern 2a of the etching stopper film 2. As a result, the etching bias was about 10 nm which was significantly smaller than that in case of dry etching on a conventional chromium-based material film.

This shows that, also in the mask blank of Example 2, in case where the etching stopper film 2 is patterned by the dry etching in the high-bias condition using the light shielding film pattern 3a as a mask and using a mixture of a chlorine-based gas and an oxygen gas, it is possible to suppress the side etching caused on a pattern side wall of the etching stopper film 2. As a consequence, collapse of the light shielding film pattern 3a due to thinning of the pattern 2a of the etching stopper film 2 can be suppressed and that even a transfer pattern having a fine pattern such as a SRAF pattern with a line width of, for example, 50 nm or less can accurately be formed.

The transfer mask 20 in Example 2 thus obtained was subjected to inspection of the mask pattern by a mask inspection apparatus. As a result, it was confirmed that, without collapse of the pattern, the fine pattern was formed in an allowable range from a designed value.

As described above, by using the mask blank of Example 2, it is possible to manufacture the transfer mask 20 provided with a high-accuracy fine transfer pattern.

Furthermore, by using AIMS193 (manufactured by Carl Zeiss), the transfer mask 20 of Example 2 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, a design specification was sufficiently satisfied. From the above, it is said that, when the transfer mask 20 manufactured from the mask blank of Example 2 is set in the exposure apparatus and is subjected to exposure transfer by exposure light of the ArF excimer laser, exposure transfer can be carried out with high accuracy onto the resist film on the semiconductor device.

Example 3

Example 3 relates to a mask blank for use in manufacture of a halftone phase shift mask (transfer mask) using an ArF excimer laser having a wavelength of 193 nm as exposure light, and to manufacture of the halftone phase shift mask (transfer mask). This example corresponds to the second embodiment mentioned above.

The mask blank 30 used in Example 3 has a structure in which a phase shift film 5, an etching stopper film 2, a light shielding film 3, and a hard mask film 4 are laminated on a transparent substrate 1 in this order, as illustrated in FIG. 2. The mask blank 30 was manufactured as follows.

The transparent substrate 1 (synthetic quartz substrate) prepared in the manner similar to Example 1 was placed in a single-wafer DC sputtering apparatus. Using a mixed target of molybdenum (Mo) and silicon (Si) (Mo:Si=12 atomic %:88 atomic %) and using a mixture of argon (Ar), nitrogen ($N_2$), and helium (He) (flow rate ratio: Ar:$N_2$:He=8:72:100, pressure: 0.2 Pa) as a sputtering gas, DC sputtering was carried out to form, on a surface of the transparent substrate 1, the phase shift film 5 comprising an MoSiN film containing molybdenum, silicon, and nitrogen (Mo: 4.1 atomic %, Si: 35.6 atomic %, N: 60.3 atomic %) to a thickness of 69 nm.

Next, the transparent substrate 1 provided with the phase shift film 5 was taken out from the sputtering apparatus. The phase shift film 5 on the transparent substrate was subjected to heat treatment in air. The heat treatment was carried out at 450° C. for 30 minutes. For the phase shift film 5 after the heat treatment, a transmittance and a phase shift amount at a wavelength (193 nm) of the ArF excimer laser was measured using a phase shift amount measuring apparatus. As a result, the transmittance was 6.44% and the phase shift amount was 174.3 degrees.

Next, the transparent substrate provided with the phase shift film 5 was introduced into the sputtering apparatus again. On the phase shift film 5, the etching stopper film 2 comprising the CrOC film of Example 1, the light shielding film 3 made of an MoSi-based material having a double layer structure (where the lower layer of the light shielding film 3 was formed to a thickness of 35 nm), and the hard mask film 4 comprising the CrOC film were formed in this order under a film forming condition same as that in Example 1.

In the above-mentioned manner, the mask blank 30 of Example 3 was prepared.

Next, using the mask blank 30 and according to the above-mentioned manufacturing process illustrated in FIGS. 4A-4G, the halftone phase shift mask was manufactured. Reference numerals hereinafter used correspond to the reference numerals in FIGS. 4A-4G.

At first, a chemically amplified resist for electron beam writing (PRL009 manufactured by Fuji Film Electronics Materials Co. Ltd.) was applied onto an upper surface of the above-mentioned mask blank 30 by spin coating and subjected to predetermined baking to form a resist film having a thickness of 80 nm. Next, using an electron beam writing apparatus, a predetermined device pattern (a pattern corresponding to a transfer pattern to be formed on the phase shift film 5) was written on the resist film and, thereafter, the resist film was developed to form a resist film pattern 7a (see FIG. 4A). The resist film pattern 7a includes a SRAF pattern having a line width (50 nm).

Next, with the resist film pattern 7a used as a mask, the hard mask film 4 was dry etched by the above-mentioned dry etching in the high-bias condition to form a hard mask film pattern 4a (see FIG. 4B). The dry etching was carried out using, as an etching gas, a mixture of a chlorine gas ($Cl_2$) and an oxygen gas ($O_2$) ($Cl_2$:$O_2$=13:1 (flow rate ratio)) with a high bias such that the power upon application of a bias voltage was 50 W.

Next, after the remaining resist film pattern 7a was removed, the light shielding film 3 of an MoSi-based double layer structure was continuously dry etched by dry etching using the hard mask film pattern 4a as a mask and using a fluorine-based gas to form a light shielding film pattern 3a (see FIG. 4C). As an etching gas, a fluorine-based gas ($SF_4$) was used.

Next, a resist film similar to that mentioned above was formed on an entire surface of the mask blank provided with the light shielding film pattern 3a. A predetermined light shielding pattern (light shielding zone pattern) was written on the resist film and, after writing, developed to thereby form a resist film pattern 7b having a predetermined light shielding pattern on the hard mask film 4 (hard mask film pattern 4a) (see FIG. 4D).

Next, through dry etching using a mixture of a chlorine-based gas and an oxygen gas, a pattern 2a was formed on the etching stopper film 2 made of a chromium-based material according to the configuration of this disclosure by using the light shielding film pattern 3a as a mask and, simultaneously, a pattern 4b having the above-mentioned light shielding pattern was formed on the hard mask film 4 with the resist film pattern 7b used as a mask (see FIG. 4E). The dry etching was carried out using, as an etching gas, a mixture of a chlorine gas ($Cl_2$) and an oxygen gas ($O_2$) ($Cl_2$:$O_2$=13:1 (flow rate ratio)) with a high bias such that the power upon application of a bias voltage was 50 W.

After completion of the dry etching, pattern inspection was carried out. As a result, no collapse of the light shielding film pattern 3a was caused.

Next, after the resist film pattern 7b was removed, through dry etching using a fluorine-based gas, a phase shift film pattern 5a was formed on the phase shift film 5 by using, as a mask, the pattern 2a formed on the etching stopper film 2 and, simultaneously, a part of the light shielding pattern 3a was removed to form a light shielding film pattern 3b with the hard mask film pattern 4b having the light shielding pattern used as a mask (see FIG. 4F). As an etching gas, a fluorine-based gas ($SF_6$) was used.

Next, through dry etching using a mixture of a chlorine gas ($Cl_2$) and an oxygen gas ($O_2$), a pattern 2b having the light shielding pattern was formed on the etching stopper film 2 (pattern 2a) by using, as a mask, the light shielding film pattern 3b provided with the light shielding pattern and, simultaneously, the remaining hard mask film pattern 4b was removed (see FIG. 4G).

In the above-mentioned manner, a halftone phase shift mask (transfer mask) 40 was completed in which the phase shift film pattern 5a to serve as a transfer pattern and the light shielding pattern (light shielding zone pattern) in an outer peripheral region were formed on the transparent substrate 1 (see FIG. 4(g)).

The above-mentioned phase shift mask 40 thus obtained was subjected to inspection of the mask pattern by a mask inspection apparatus. As a result, it was confirmed that, without collapse of the pattern, the fine pattern of the phase shift film was formed in an allowable range from a designed value.

By using the mask blank 30 in Example 3, it is possible to suppress side etching caused on a pattern side wall of the etching stopper film 2 when the etching stopper film 2 is patterned by dry etching using, as a mask, the light shielding film pattern 3a formed on the light shielding film 3 and using the mixture of the chlorine-based gas and the oxygen gas and (the step in FIG. 4E) and to suppress collapse of the light shielding film pattern 3a due to thinning of the pattern 2a of the etching stopper film 2. Therefore, even a fine light shielding film pattern (transfer pattern) can accurately be formed. Furthermore, by patterning the phase shift film 5 using, as a mask, the pattern 2a of the etching stopper film 2 without thinning of the pattern width due to the side etching (the step in FIG. 4F), it is possible to accurately form a fine transfer pattern on the phase shift film 5 also.

Furthermore, by using AIMS193 (manufactured by Carl Zeiss), the transfer mask 40 was subjected to simulation of an exposure transfer image when exposure transfer was carried out onto a resist film on a semiconductor device using exposure light having a wavelength of 193 nm. When the exposure transfer image obtained by the simulation was verified, a design specification was sufficiently satisfied. From the above, with the transfer mask 40 manufactured from the mask blank of Example 3, exposure transfer can be carried out with high accuracy onto the resist film on the semiconductor device.

Example 4

Example 4 relates to manufacture of a phase shift mask (chromeless phase shift mask) of a substrate eroded type using a mask blank of a configuration similar to that of the mask blank 10 in Example 1. Description will be made according to the manufacturing process illustrated in FIGS. 5A-5G The mask blank used in Example 4 has a structure in which an etching stopper film 2, a light shielding film 3, and a hard mask film 4 are laminated on a transparent substrate 1 in this order and was manufactured as follows.

The transparent substrate 1 (synthetic quartz substrate) prepared in the manner similar to Example 1 was placed in a single-wafer DC sputtering apparatus. Under a film forming condition same as that in Example 1, the etching stopper film 2 comprising the CrOC film in Example 1 was formed on the substrate.

Next, on the etching stopper film 2, the MoSi-based light shielding film 3 of a double layer structure comprising a lower layer 31 of an-MoSiN film and an upper layer 32 of an MoSiN film was formed in a film forming condition same as that in Example 1. Subsequently, the hard mask film 4 comprising the CrOC film was formed on the light shielding film 3 under a film forming condition same as that in Example 1.

In the above-mentioned manner, the mask blank in Example 4 was prepared.

Next, using the mask blank in Example 4, the phase shift mask was manufactured according to the manufacturing process illustrated in FIGS. 5A-5G.

At first, a chemically amplified resist for electron beam writing (PRL009 manufactured by Fuji Film Electronics Materials Co. Ltd.) was applied onto an upper surface of the above-mentioned mask blank by spin coating and subjected to predetermined baking to form a resist film having a thickness of 80 nm. Next, using an electron beam writing apparatus, a predetermined device pattern (a pattern corresponding to a transfer pattern to be eroded in the substrate) was written on the resist film and, thereafter, the resist film was developed to form a resist film pattern 8a (see FIG. 5A). The resist film pattern 8a includes a line-and-space pattern having a line width of 50 nm.

Figure 5A:
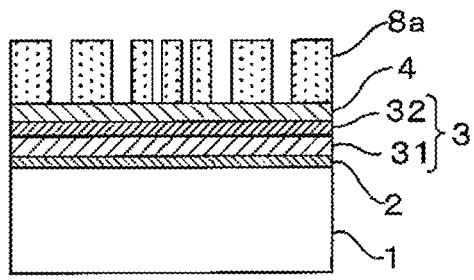
FIGS. 5A-5G are schematic sectional view for illustrating a manufacturing process of a transfer mask (phase shift mask)
Figure 5E:
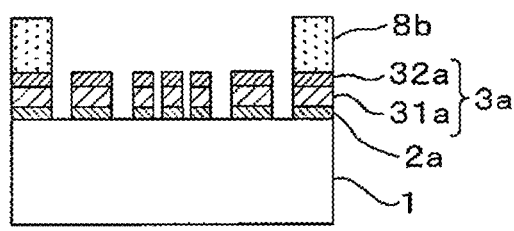
Figure 5B:
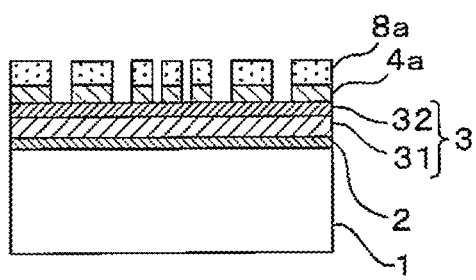

Next, with the resist film pattern 8a as a mask, the hard mask film 4 was dry etched by the above-mentioned dry etching in the high-bias condition to form a hard mask film pattern 4a (see FIG. 5B). The dry etching was carried out using, as an etching gas, a mixture of a chlorine gas ($Cl_2$) and an oxygen gas ($O_2$) ($Cl_2:O_2$=13:1 (flow rate ratio)) with a high bias such that the power upon application of a bias voltage was 50 W.

Figure 5F:
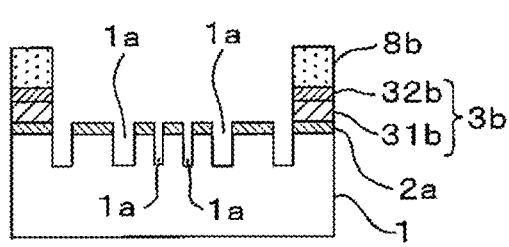
Figure 5C:
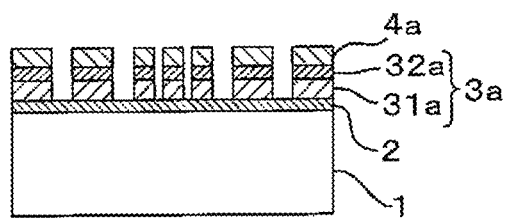

Next, after the above-mentioned resist film pattern 8a was removed, the light shielding film 3 of an MoSi-based double layer structure was continuously dry etched using the hard mask film pattern 4a as a mask and using a fluorine-based gas ($SF_6$) as an etching gas to form a light shielding film pattern 3a (see FIG. 5C).

Figure 5G:
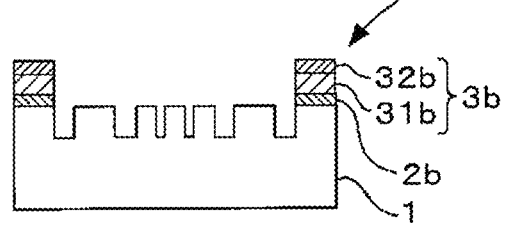
Figure 5D:
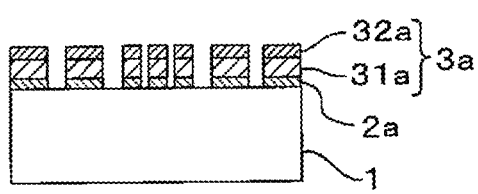

Next, the etching stopper film 2 was dry etched by the above-mentioned dry etching in the high-bias condition with the light shielding film pattern 3a used as a mask to form a pattern 2a on the etching stopper film 2 and, simultaneously, the hard mask film pattern 4a was removed (see FIG. 5D). The dry etching was carried out using a mixture of a chlorine gas ($Cl_2$) and an oxygen gas ($O_2$) ($Cl_2:O_2$:13:1 (flow rate ratio)) as an etching gas with a high bias such that the power upon application of a bias voltage was 50 W.

After completion of the dry etching, pattern inspection was carried out. As a result, no collapse of the light shielding film pattern 3a was caused.

Next, a resist film similar to that mentioned above was formed on an entire surface of the mask blank provided with the light shielding film pattern 3a. A predetermined light shielding pattern (light shielding zone pattern) was written on the resist film and, after writing, developed to thereby form a resist film pattern 8b having a light shielding pattern (see FIG. 5E).

Next, through dry etching using the resist film pattern 8b as a mask and using a fluorine-based gas, the light shielding pattern 3a as exposed was peeled off and removed and, simultaneously, the transparent substrate 1 (synthetic quartz substrate) was dry etched using, as a mask, the pattern 2a formed on the etching stopper film 2 to form a phase shift pattern 1a of a substrate eroded type was formed (see FIG. 5F). At this time, the transparent substrate was eroded to a depth (about 173 nm) at which a phase difference of 180 degrees was obtained. As an etching gas of the dry etching, a mixture of a fluorine-based gas ($CF_4$) and helium (He) was used.

Next, through dry etching using the resist film pattern 8b as a mask and using a mixture of a chlorine gas ($Cl_2$) and an oxygen gas ($O_2$) ($Cl_2:O_2$=4:1 (flow rate ratio)), the pattern 2a of the etching stopper film 2 as exposed was peeled off and removed and, simultaneously, the remaining resist film pattern 8b was removed (see FIG. 5G).

In the above-mentioned manner, a phase shift mask (transfer mask) 50 of a substrate eroded type was completed in which the phase shift pattern 1a of a eroded type and the light shielding pattern (light shielding zone pattern) in an outer peripheral region are formed on the transparent substrate 1 (see FIG. 5G).

The phase shift mask 50 thus obtained was subjected to inspection of the mask pattern by a mask inspection apparatus. As a result, it was confirmed that the phase shift pattern was formed within an allowable range from a designed value.

In Example 4 also, when the etching stopper film 2 is patterned by dry etching using the mixture of the chlorine-based gas and the oxygen gas and using, as a mask, the light shielding film pattern 3a formed on the light shielding film 3 (the step in FIG. 5D), it is possible to suppress side etching caused on the pattern side wall of the etching stopper film 2 and to suppress collapse of the light shielding film pattern 3a due to thinning of the pattern 2a of the etching stopper film 2. Furthermore, by eroding the substrate using, as a mask, the pattern 2a of the etching stopper film 2 without thinning of the pattern width due to the side etching (the step in FIG. 5F), it is possible to accurately form a fine phase shift pattern by substrate eroding.

Furthermore, by using AIMS193 (manufactured by Carl Zeiss), the phase shift mask 50 was subjected to simulation of an exposure transfer image when exposure transfer was carried out onto a resist film on a semiconductor device using exposure light having a wavelength of 193 nm. When the exposure transfer image obtained by the simulation was verified, a design specification was sufficiently satisfied. Accordingly, with the phase shift mask 50 manufactured from the mask blank of Example 4, exposure transfer can be carried out with high accuracy onto the resist film on the semiconductor device.

Comparative Example 1

A mask blank of Comparative Example 1 was prepared in the manner similar to Example 1 except an etching stopper film. The etching stopper film in Comparative Example 1 was formed in a film forming condition changed from that of the etching stopper film 2 in Example 1 as follows.

Specifically, a transparent substrate (synthetic quartz substrate) same as that in Example 1 was placed in a single-wafer DC sputtering apparatus. Using a target comprising chromium, reactive sputtering was carried out in a mixture atmosphere of Argon (Ar), carbon dioxide ($CO_2$), nitrogen ($N_2$), and helium (He) so that the etching stopper film comprising a CrOCN film containing chromium, oxygen, carbon, and nitrogen was formed on a main surface of the transparent substrate to the thickness of 10 nm. Next, on the etching stopper film, the MoSi-based light shielding film 3 and the hard mask film 4 in Example 1 were successively formed under a condition same as that in Example 1.

In the above-mentioned manner, the mask blank of Comparative Example 1 was prepared.

Next, an item was prepared in which only the etching stopper film in Comparative Example 1 was formed on a main surface of another transparent substrate in a condition same as that mentioned above. The etching stopper film of Comparative Example 1 was analyzed by X-ray photoelectron spectroscopy (with RBS correction). As a result, it was confirmed that the contents of the respective constituent elements in the etching stopper film of Comparative Example 1 were Cr: 55 atomic %, O: 22 atomic %, C: 12 atomic %, and N: 11 atomic % in average. Furthermore, it was confirmed that, in the etching stopper film, a difference in content of each constituent element in the thickness direction was 3 atomic % or less (except a region near a surface of the etching stopper film where an analysis result is subject to influence of air) and there was no substantial composition gradient in the thickness direction.

Figure 16:
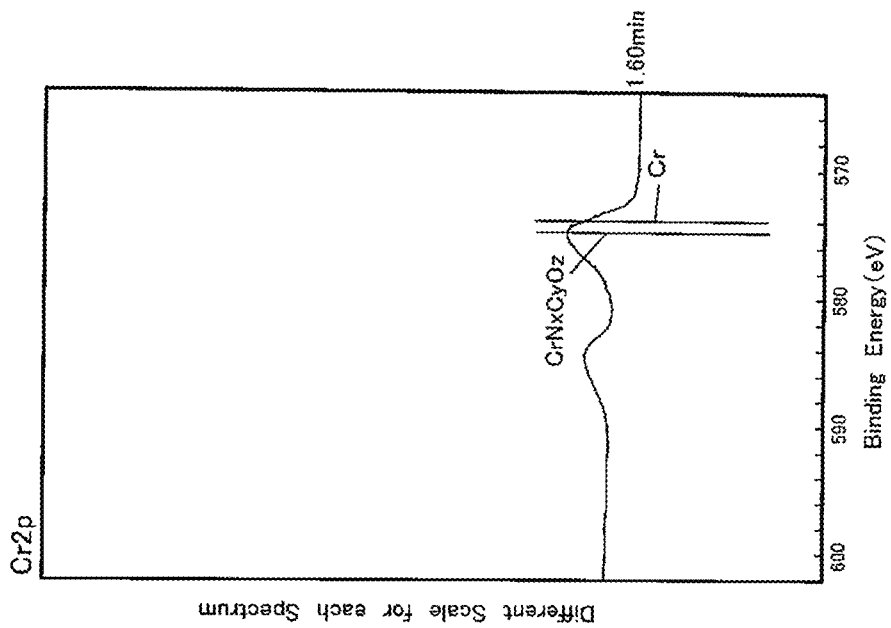
FIG. 16 is a view for illustrating a Cr2p narrow spectrum obtained by analyzing a hard mask film of a mask blank of Comparative Example by X-ray photoelectron spectroscopy (XPS)
Figure 17:
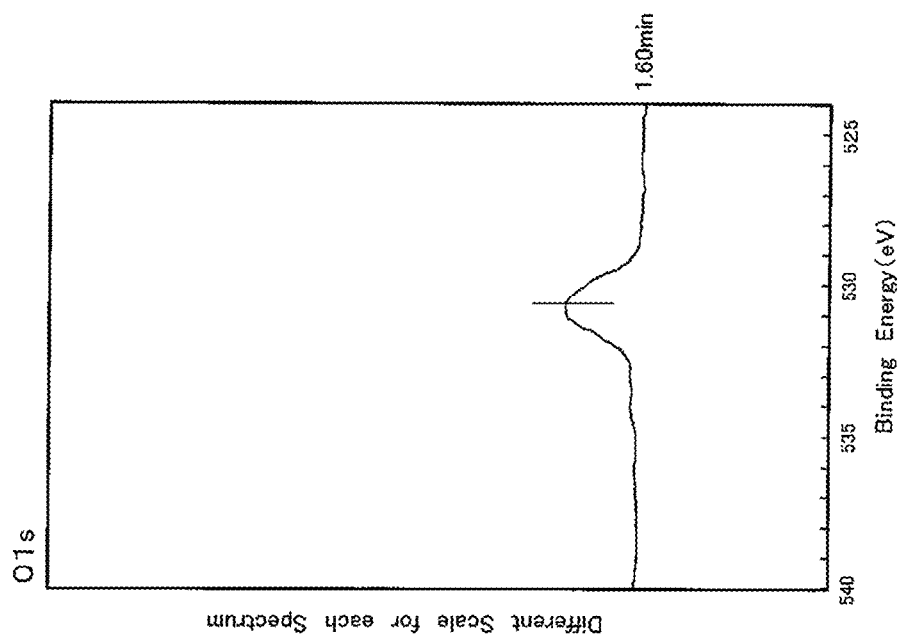
FIG. 17 is a view for illustrating an O1s narrow spectrum obtained by analyzing the hard mask film of the mask blank of Comparative Example by X-ray photoelectron spectroscopy (XPS)
Figure 18:
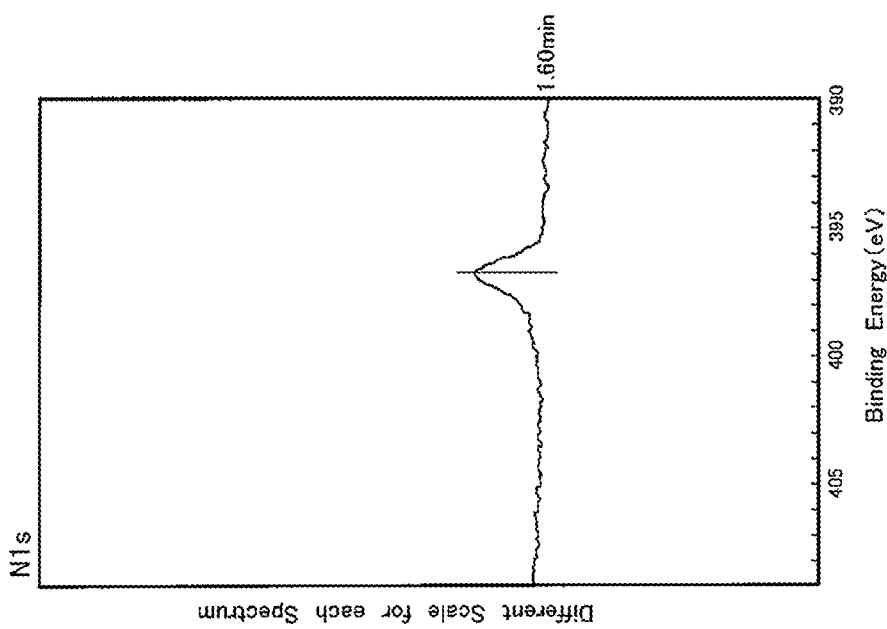
FIG. 18 is a view for illustrating an N1s narrow spectrum obtained by analyzing the hard mask film of the mask blank of Comparative Example by X-ray photoelectron spectroscopy (XPS)
Figure 19:
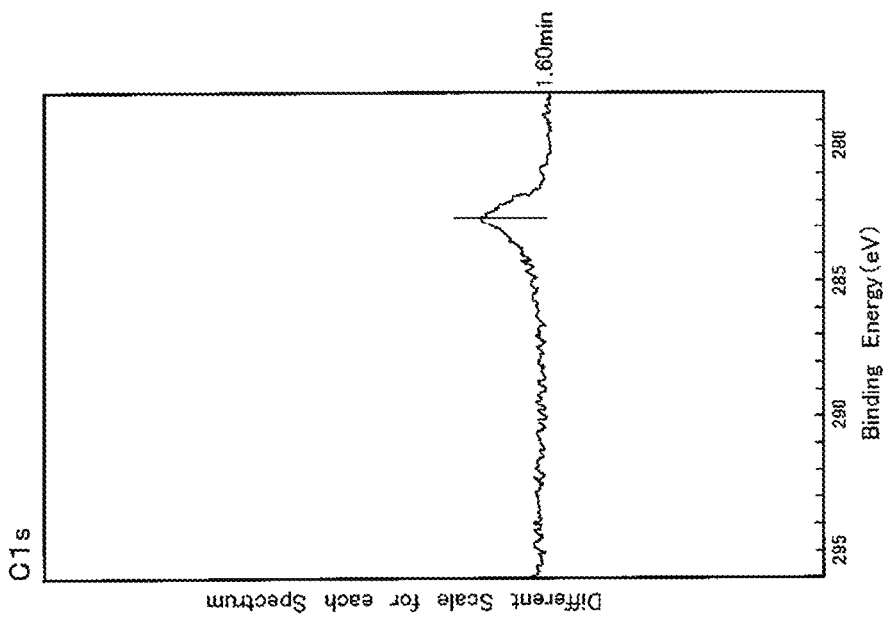
FIG. 19 is a view for illustrating a C1s narrow spectrum obtained by analyzing the hard mask film of the mask blank of Comparative Example by X-ray photoelectron spectroscopy (XPS)
Figure 20:
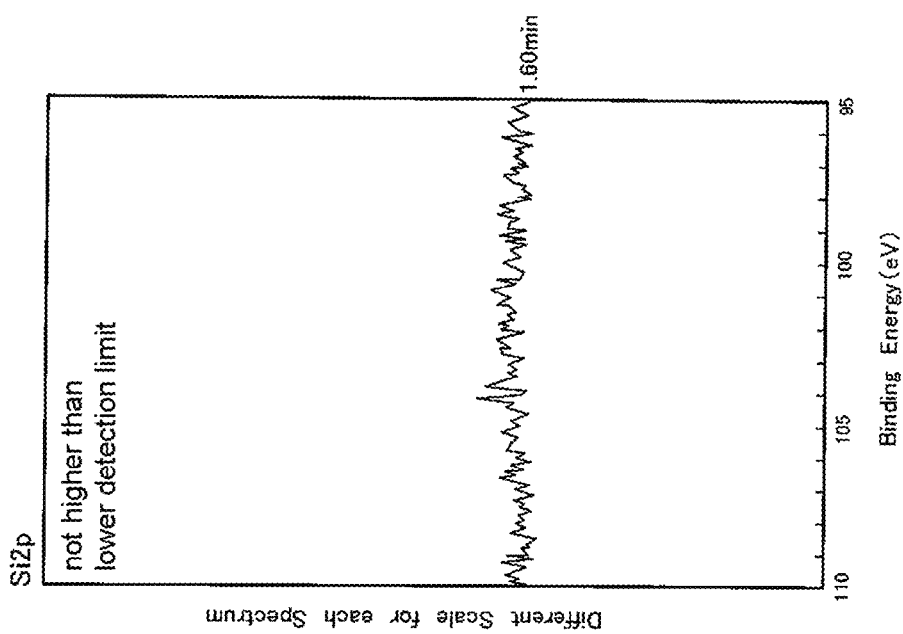
FIG. 20 is a view for illustrating an Si2p narrow spectrum obtained by analyzing the hard mask film of the mask blank of Comparative Example by X-ray photoelectron spectroscopy (XPS)

In the manner similar to Example 1, FIG. 16 shows a result of depth direction chemical bonding state analysis of Cr2p narrow spectrum, obtained by analysis on the etching stopper film in Comparative Example 1 by X-ray photoelectron spectroscopy. FIG. 17 shows a result of depth direction chemical bonding state analysis of O1s narrow spectrum. FIG. 18 shows a result of depth direction chemical bonding state analysis of N1s narrow spectrum. FIG. 19 shows a result of depth direction chemical bonding state analysis of C1s narrow spectrum. FIG. 20 shows a result of depth direction chemical bonding state analysis of Si2p narrow spectrum.

In each depth direction chemical bonding state analysis in FIGS. 16 to 20, a plot "1.60 min" in each figure shows an analysis result at a position (position at a depth of about 7 nm from the uppermost surface) in the film thickness direction of the etching stopper film after eroding the etching stopper film from the uppermost surface for 1.60 min by Ar gas sputtering.

From the result of Cr2p narrow spectrum in FIG. 16, it is understood that the etching stopper film of Comparative Example 1 has a maximum peak at a binding energy greater than 574 eV. The above-mentioned result means a so-called chemical shift state which is a state where an abundance ratio of chromium atoms which are not bonded to atoms such as nitrogen and oxygen is considerably small. Therefore, resistance against etching based on a chemical reaction is low and side etching is difficult to suppress.

From the analysis result of O1s narrow spectrum in FIG. 17, it is understood that the etching stopper film of Comparative Example 1 has a maximum peak at a binding energy of about 530 eV. The above-mentioned result means that Cr—O bond exists at a predetermined ratio or more.

From the analysis result of N1s narrow spectrum in FIG. 18, it is understood that the etching stopper film of Comparative Example 1 has a maximum peak at a binding energy of about 397 eV. The above-mentioned result means that Cr—N bond exists in the etching stopper film of Comparative Example 1 at a predetermined ratio or more. Therefore, it may be said that side etching easily progresses.

From the analysis result of C1s narrow spectrum in FIG. 19, it is understood that the etching stopper film of Comparative Example 1 has a maximum peak at a binding energy of 283 eV. The above-mentioned result means that Cr—C bond exists at a predetermined ratio or more.

From the analysis result of Si2p narrow spectrum in FIG. 20, it is understood that the etching stopper film of Comparative Example 1 has a maximum peak which is not higher than a detection lower limit. The above-mentioned result means that atoms bonded to silicon, including Cr—Si bond, were not detected in the etching stopper film of Comparative Example 1.

Next, using the mask blank in Comparative Example 1, a transfer mask (binary mask) in Comparative Example 1 was manufactured according to a manufacturing process similar to that in Example 1 mentioned above.

Furthermore, by the procedure similar to Example 1, another transfer mask of Comparative Example 1 was manufactured. A cross-section STEM image of a region where a SRAF pattern was formed was acquired and a line width of each of a light shielding film pattern and a pattern of the etching stopper film was measured.

Then, an etching bias was calculated which was a variation amount between the line width of the light shielding film pattern and the line width of the pattern of the etching stopper film. As a result, the etching bias was about 27 nm which was relatively large, like in case of dry etching on a conventional chromium-based material film.

This shows that, in the mask blank of Comparative Example 1, in case where the etching stopper film is patterned by the dry etching in the high-bias condition using the light shielding film pattern as a mask and using a mixture of a chlorine-based gas and an oxygen gas, it is difficult to suppress the side etching amount generated on a pattern side wall of the etching stopper film. As a consequence, collapse of the light shielding film pattern due to thinning of the pattern of the etching stopper film occurs and a fine transfer pattern having a line width of, for example, 50 nm or less is difficult to be accurately formed.

Actually, the obtained transfer mask of Comparative Example 1 was subjected to inspection of the mask pattern by a mask inspection apparatus. As a result, it was confirmed that collapse of the light shielding film pattern occurred.

Furthermore, by using AIMS193 (manufactured by Carl Zeiss), the transfer mask 20 of Comparative Example 1 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, transfer defect was confirmed. It is presumed that the defect was caused by a factor of the above-mentioned collapse of the light shielding film pattern.

Comparative Example 2

A mask blank of Comparative Example 2 was prepared in the manner similar to Example 1 except an etching stopper film. The etching stopper film in Comparative Example 2 was formed in a film forming condition changed from that of the etching stopper film in Example 1 as follows.

Specifically, a transparent substrate same as that in Example 1 was placed in a single-wafer DC sputtering apparatus. Using a target comprising chromium, reactive sputtering was carried out in a mixture atmosphere of Argon (Ar), nitrogen monoxide (NO), and helium (He) so that the etching stopper film comprising a CrON film containing chromium, oxygen, and nitrogen was formed on a main surface of the transparent substrate to the thickness of 10 nm. Next, on the etching stopper film, the MoSi-based light shielding film 3 and the hard mask film 4 in Example 1 were successively formed in a condition same as that in Example 1.

In the above-mentioned manner, the mask blank of Comparative Example 2 was prepared.

Next, an item was prepared in which only the etching stopper film of Comparative Example 2 was formed on another transparent substrate in a condition same as that mentioned above. The etching stopper film of Comparative Example 2 was analyzed by X-ray photoelectron spectroscopy (with RBS correction). As a result, it was confirmed that the contents of the respective constituent elements in the etching stopper film in Comparative Example 2 were Cr: 58 atomic %, O: 17 atomic %, and N: 25 atomic % in average. Furthermore, it was confirmed that, in the etching stopper film, a difference in content of each constituent element in the thickness direction was 3 atomic % or less (except a region near a surface of the etching stopper film where an analysis result is subject to influence of air) and there was no substantial composition gradient in the thickness direction.

In the manner similar to Example 1, the etching stopper film of Comparative Example 2 was subjected to analysis of X-ray photoelectron spectroscopy to acquire a result of depth direction chemical bonding state analysis of Cr2p narrow spectrum, a result of depth direction chemical bonding state analysis of O1s narrow spectrum, a result of depth direction chemical bonding state analysis of N1s narrow spectrum, a result of depth direction chemical bonding state analysis of C1s narrow spectrum, and a result of depth direction chemical bonding state analysis of Si2p narrow spectrum.

From the analysis result of Cr2p narrow spectrum, it is understood that the etching stopper film of Comparative Example 2 has a maximum peak at a binding energy greater than 574 eV. The above-mentioned result means a so-called chemical shift state where an abundance ratio of chromium atoms which are not bonded to atoms such as nitrogen and oxygen is considerably small. Therefore, resistance against etching based on the chemical reaction is low and side etching is difficult to suppress.

From the analysis result of O1s narrow spectrum, it is understood that the etching stopper film of Comparative Example 2 has a maximum peak at a binding energy of about 530 eV. The above-mentioned result means that Cr—O bond exists at a predetermined ratio or more.

From the analysis result of N1s narrow spectrum, it is understood that the etching stopper film of Comparative Example 2 has a maximum peak at a binding energy of about 397 eV. The above-mentioned result means that Cr—N bond exists in the etching stopper film of Comparative Example 2 at a predetermined ratio or more. Therefore, it may be said that side etching easily progresses.

From the analysis result of C1s narrow spectrum, it is understood that the etching stopper film of Comparative Example 2 has a maximum peak which is not higher than a detection lower limit. The above-mentioned result means that atoms bonded to carbon, including Cr—C bond, were not detected in the etching stopper film of Comparative Example 2.

From the analysis result of Si2p narrow spectrum, it is understood that the etching stopper film of Comparative Example 2 has a maximum peak which is not higher than a detection lower limit. The above-mentioned result means that atoms bonded to silicon, including Cr—Si bond, were not detected in the etching stopper film of Comparative Example 2.

Next, using the mask blank of Comparative Example 2, a binary-type transfer mask of Comparative Example 2 was manufactured according to the manufacturing process similar to that in Example 1 mentioned above.

Furthermore, by the procedure similar to Example 1, another transfer mask of Comparative Example 2 was manufactured. A cross-section STEM image of a region where a SRAF pattern was formed was acquired and a line width of each of a light shielding film pattern and a pattern of the etching stopper film was measured.

Then, an etching bias was calculated which was a variation amount between the line width of the light shielding film pattern and the line width of the pattern of the etching stopper film. As a result, the etching bias was 30 nm which was substantially large, as compared with the case of dry etching on a conventional chromium-based material film.

This shows that, in the mask blank of Comparative Example 2, in case where the etching stopper film is patterned by the dry etching in the high-bias condition using the light shielding film pattern as a mask and using a mixture of a chlorine-based gas and an oxygen gas, it is difficult to suppress the side etching amount generated on a pattern side wall of the etching stopper film. As a consequence, collapse of the light shielding film pattern due to thinning of the pattern of the etching stopper film occurs and a fine transfer pattern having a line width of, for example, 50 nm or less is difficult to be accurately formed.

Actually, the obtained transfer mask of Comparative Example 2 was subjected to inspection of the mask pattern by a mask inspection apparatus. As a result, it was confirmed that collapse of the light shielding film pattern occurred.

Furthermore, by using AIMS193 (manufactured by Carl Zeiss), the transfer mask of Comparative Example 2 was subjected to simulation of an exposure transfer image when exposure transfer was carried out onto a resist film on a semiconductor device using exposure light having a wavelength of 193 nm, in the manner similar to Example 1. When the exposure transfer image obtained by the simulation was verified, transfer defect was confirmed. It is presumed that the defect was caused by a factor of the above-mentioned collapse of the light shielding film pattern.

While the embodiments and the examples of this disclosure have thus far been described, they are merely for illustration purpose and do not limit the scope of the claims. The techniques described in the claims encompass modifications and alterations of the specific examples illustrated in the foregoing.

EXPLANATION OF REFERENCE NUMERALS 1 transparent substrate
2 etching stopper film
3 light shielding film (pattern-forming thin film)
4 hard mask film
5 phase shift film
6a, 7a, 7b, 8a, 8b resist film pattern
10, 30 mask blank
20 transfer mask (binary mask)
40 transfer mask (halftone phase shift mask)
50 transfer mask (phase shift mask)

The invention claimed is:

1. A mask blank comprising:
a substrate;
an etching stopper film formed on the substrate; and
a pattern-forming thin film formed on the etching stopper film,
wherein the pattern-forming thin film contains one or more elements selected from silicon and tantalum, and
wherein the etching stopper film contains chromium, oxygen, and carbon, and
wherein a total content of chromium, oxygen, and carbon in the etching stopper film is 95 atomic % or more, and
wherein a chromium content of the etching stopper film is 50 atomic % or more, and
wherein a ratio of a carbon content [atomic %] of the etching stopper film divided by the total content [atomic %] of chromium, oxygen, and carbon, in the etching stopper film is 0.1 or more, and
wherein a nitrogen content of the etching stopper film is not higher than a detection lower limit in composition analysis by X-ray photoelectron spectroscopy.

2. The mask blank according to claim 1, wherein the chromium content of the etching stopper film is 80 atomic % or less.

3. The mask blank according to claim 1, wherein the carbon content of the etching stopper film is 10 atomic % or more and 20 atomic % or less.

4. The mask blank according to claim 1, wherein an oxygen content of the etching stopper film is 10 atomic % or more and 35 atomic % or less.

5. The mask blank according to claim 1, wherein a silicon content of the etching stopper film is 1 atomic % or less.

6. The mask blank according to claim 1, wherein, for each constituent element of the etching stopper film, a content of the constituent element in the etching stopper film does not change, along a direction that is orthogonal to a surface of the etching stopper film, by more than 10 atomic %.

7. The mask blank according to claim 1, wherein a thickness of the etching stopper film is 3 nm or more and 20 nm or less.

8. The mask blank according to claim 1, comprising a hard mask film formed on the pattern-forming thin film and containing chromium.

9. The mask blank according to claim 1, comprising a phase shift film formed between the substrate and the etching stopper film and containing silicon.

10. A method for using the mask blank according to claim 8 to manufacture a transfer mask, the method comprising:
performing a first dry etching to form a transfer pattern on the hard mask film, wherein a mask used for the first dry etching is a resist film formed on the hard mask film and having the transfer pattern and wherein a gas used for the first dry etching is a first mixture of a chlorine-based gas and an oxygen gas;
performing a second dry etching to form the transfer pattern on the pattern-forming thin film, wherein a mask used for the second dry etching is the hard mask film provided with the transfer pattern and wherein a gas used for the second dry etching is a fluorine-based gas; and
performing a third dry etching to form the transfer pattern on the etching stopper film and to remove the hard mask film, wherein a mask used for the third dry etching is the pattern-forming thin film provided with the transfer pattern and wherein a gas used for the third dry etching is a second mixture of a chlorine-based gas and an oxygen gas.

11. A method for manufacturing a transfer mask using the mask blank according to claim 9, comprising:
performing a first dry etching to form a transfer pattern on the hard mask film, wherein a mask used for the first dry etching is a resist film formed on the hard mask film and having the transfer pattern and wherein a gas used for the first dry etching is a first mixture of a chlorine-based gas and an oxygen gas;
performing a second dry etching to form the transfer pattern on the pattern-forming thin film, wherein a mask used for the second dry etching is the hard mask film provided with the transfer pattern and wherein a gas used for the second dry etching is a first fluorine-based gas;
forming, on the hard mask film, a resist film having a light shielding pattern;
performing a third dry etching, using a second mixture of a chlorine-based gas and an oxygen gas, to form the transfer pattern on the etching stopper film by using, as a mask, the pattern-forming thin film provided with the transfer pattern and simultaneously to form the light shielding pattern on the hard mask film by using, as a mask, the resist film having the light shielding pattern;
performing a fourth dry etching, using a second fluorine-based gas, to form the transfer pattern on the phase shift film by using, as a mask, the etching stopper film provided with the transfer pattern and simultaneously to form the light shielding pattern on the pattern-forming thin film by using, as a mask, the hard mask film having the light shielding pattern; and performing a fifth dry etching to form the light shielding pattern on the etching stopper film and to remove the hard mask film, wherein a mask used for the fifth dry etching is the pattern-forming thin film provided with the light shielding pattern and wherein a gas used for the fifth dry etching is a third mixture of a chlorine-based gas and an oxygen gas.

12. A method for manufacturing a semiconductor device, comprising exposure-transferring the transfer pattern onto a resist film on a semiconductor substrate by using a transfer mask manufactured by the method for manufacturing a transfer mask according to claim 10.

13. A method for manufacturing a semiconductor device, comprising exposure-transferring the transfer pattern onto a resist film on a semiconductor substrate by using a transfer mask manufactured by the method for manufacturing a transfer mask according to claim 11.

* * * * *